(12) United States Patent
Shiue et al.

(10) Patent No.: US 7,867,795 B2
(45) Date of Patent: Jan. 11, 2011

(54) MANUFACTURING METHOD OF LIGHT EMITTING DIODE APPARATUS

(75) Inventors: Ching-Chuan Shiue, Taoyuan Hsien (TW); Shih-Peng Chen, Taoyuan Hsien (TW); Chao-Min Chen, Taoyuan Hsien (TW); Huang-Kun Chen, Taoyuan Hsien (TW)

(73) Assignee: Delta Electronics Inc., Taoyuan Hsien (TW)

( * ) Notice: Subject to any disclaimer, the term of this patent is extended or adjusted under 35 U.S.C. 154(b) by 231 days.

(21) Appl. No.: 12/143,486

(22) Filed: Jun. 20, 2008

(65) Prior Publication Data
US 2009/0014747 A1 Jan. 15, 2009

(30) Foreign Application Priority Data
Jul. 10, 2007 (TW) .............................. 96125036 A

(51) Int. Cl.
*H01L 21/00* (2006.01)
(52) U.S. Cl. .................. 438/28; 438/34; 257/E21.599; 257/E21.51
(58) Field of Classification Search .................. 438/28, 438/34, 670; 257/E21.599, E21.51
See application file for complete search history.

(56) References Cited

U.S. PATENT DOCUMENTS

| | | | | |
|---|---|---|---|---|
| 6,786,390 B2 * | 9/2004 | Yang et al. | ............... | 228/179.1 |
| 7,348,212 B2 * | 3/2008 | Schiaffino et al. | ........... | 438/106 |
| 7,579,204 B2 * | 8/2009 | Nemoto | ....................... | 438/35 |
| 2006/0063351 A1 * | 3/2006 | Jain | ........................... | 438/455 |
| 2006/0151801 A1 * | 7/2006 | Doan et al. | .................... | 257/99 |
| 2006/0154393 A1 * | 7/2006 | Doan et al. | .................... | 438/26 |
| 2007/0004066 A1 * | 1/2007 | Wuu et al. | ..................... | 438/29 |
| 2008/0305631 A1 * | 12/2008 | Hirao | ......................... | 438/680 |
| 2009/0014738 A1 * | 1/2009 | Shiue et al. | .................... | 257/98 |

FOREIGN PATENT DOCUMENTS

TW 543210 7/2003

\* cited by examiner

*Primary Examiner*—Caridad M Everhart
(74) *Attorney, Agent, or Firm*—Muncy, Geissler, Olds & Lowe, PLLC

(57) ABSTRACT

A manufacturing method of a light emitting diode (LED) apparatus includes the steps of: forming at least one temporary substrate, which is made by a curable material, on a LED device; and forming at least a thermal-conductive substrate on the LED device. The manufacturing method does not need the step of adhering the semiconductor structure onto another substrate by using an adhering layer, and can make the devices to be in sequence separated after removing the temporary substrate, thereby obtaining several LED apparatuses. As a result, the problem of current leakage due to the cutting procedure can be prevented so as to reduce the production cost and increase the production yield.

24 Claims, 32 Drawing Sheets

MANUFACTURING METHOD OF LIGHT EMITTING DIODE APPARATUS

CROSS REFERENCE TO RELATED APPLICATIONS

This Non-provisional application claims priority under 35 U.S.C. §119(a) on Patent Application No(s). 096125036 filed in Taiwan, Republic of China on Jul. 10, 2007, the entire contents of which are hereby incorporated by reference.

BACKGROUND OF THE INVENTION

1. Field of Invention

The invention relates to a manufacturing method of a light-emitting diode (LED) apparatus.

2. Related Art

A light-emitting diode (LED) apparatus is a light-emitting device made of semiconductor material. It pertains to a cold light emitting element and has the advantages of low power consumption, long lifetime and fast response speed. In addition, the LED apparatus has small size so that it can be used to manufacture fine device or array-type device. Therefore, the applications of the LED apparatus can be spread into the indicator of a computer or a house appliance product, the backlight source of a LCD device, and the light of traffic sign or vehicle.

To increase the lighting efficiency of the LED apparatus, a metal reflective substrate is added to a LED device for reflecting light, thereby increasing the lighting efficiency. However, this architecture of the LED apparatus still has some problems to be solved.

FIG. 1 shows a LED apparatus disclosed in a Taiwan Patent number 544,958. The LED apparatus includes a metal reflective substrate 801 and a multilayer disposed on the metal reflective substrate 801. The multilayer includes a first reaction layer 802, a transparent adhering layer 803, a second reaction layer 804, a transparent conductive layer 805, a first contact layer 806, a p-type epitaxial layer 807, a light-emitting layer 808, an n-type epitaxial layer 809 and a second contact layer 810 in sequence. In addition, electrodes 811 and 812 are respectively formed on the second contact layer 810 and the transparent conductive layer 805.

The transparent adhering layer 803 attaches the first reaction layer 802 and the second reaction layer 804 and also connects the metal reflective substrate 801 to the first reaction layer 802. However, since the transparent adhering layer 803 is made of a plastic material, the heat generated by the LED apparatus cannot be transferred to the metal reflective substrate 801 and then be dissipated. Thus, the heat is accumulated inside the LED apparatus, resulting in the decrease of the efficiency.

Moreover, during the manufacturing processes, the metal reflective substrate 801 and the multilayer are cut to obtain a plurality of LED apparatuses. However, metal particles may be attached to the side surface of the multilayer in the cutting process, which will increase the current leakage from the multilayer.

FIG. 2 shows a LED apparatus disclosed in a Taiwan Patent number 543,210. A metal bonding layer 901 is provided to connect a LED multilayer 902 and a metal reflective substrate 903. In this case, a high-temperature high-pressure process is needed to connect the metal bonding layer 901 and the metal reflective substrate 903. However, this method will lead to diffusion between the LED multilayer 902 and the metal reflective substrate 903. In addition, regarding to the LED apparatus, the dicing process may also increase the current leakage of the LED multilayer 902.

The above-mentioned conventional LED apparatuses both form the epitaxial multilayer on an epitaxial substrate, and then transfer it onto a glass substrate or a plating substrate. Furthermore, a dicing process is necessary to obtain the desired LED apparatuses. Thus, the conventional manufacturing methods not only need the additional dicing process, but also increase the possibility of attaching the metal particles on the side wall of the multilayer.

Therefore, it is an important subject to provide a manufacturing method of a LED apparatus for solving the above problems and thus increasing the performance thereof.

SUMMARY OF THE INVENTION

In view of the foregoing, the invention is to provide a manufacturing method of a LED apparatus that can fabricate the LED apparatus without the dicing process, thereby reducing the production cost and decreasing the current leakage.

To achieve the above, the invention discloses a manufacturing method of a LED apparatus including the following steps of: forming at least one temporary substrate on a LED device, and forming at least one thermal-conductive substrate on the LED device.

In the invention, the temporary substrate can be a curable material. In addition, after removing the epitaxial substrate by laser lift-off, etching, polishing or laser ablation, the temporary substrate is removed so as to obtain the LED apparatus. Thus, the dicing process is unnecessary, so that the possibility of attaching the metal particles onto the side wall of the epitaxial multilayer can be decreased.

As mentioned above, the manufacturing method of a LED apparatus according to the invention is to form a temporary substrate on the LED device and form at least one thermal-conductive substrate on the LED device. Since the temporary substrate is made of the curable material, which has the properties of removable, expansible and extendible, it can be easily removed. Compared with the prior art, the invention can obtain a plurality of LED apparatuses by simply removing the temporary substrate. Therefore, the current leakage caused by the dicing process can be prevented, thereby decreasing the production cost and increasing the production yield.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 1:
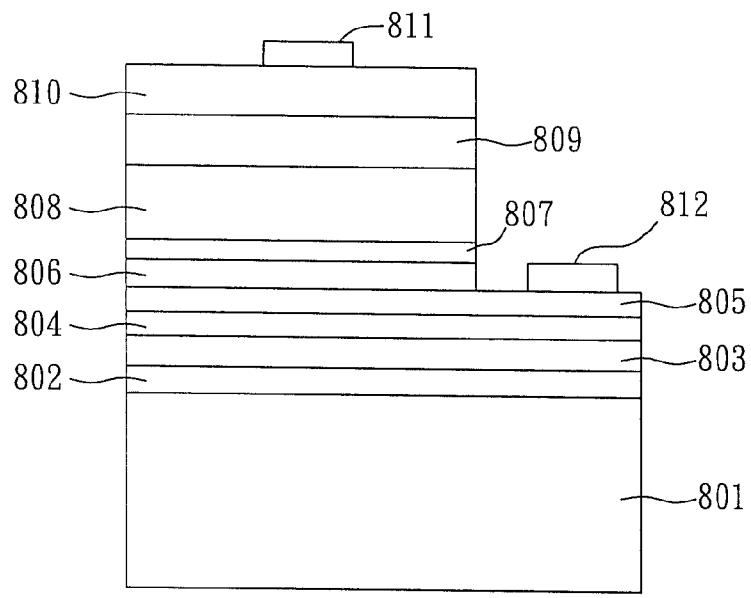
FIG. 1 is a schematic view of a conventional LED apparatus.
Figure 2:
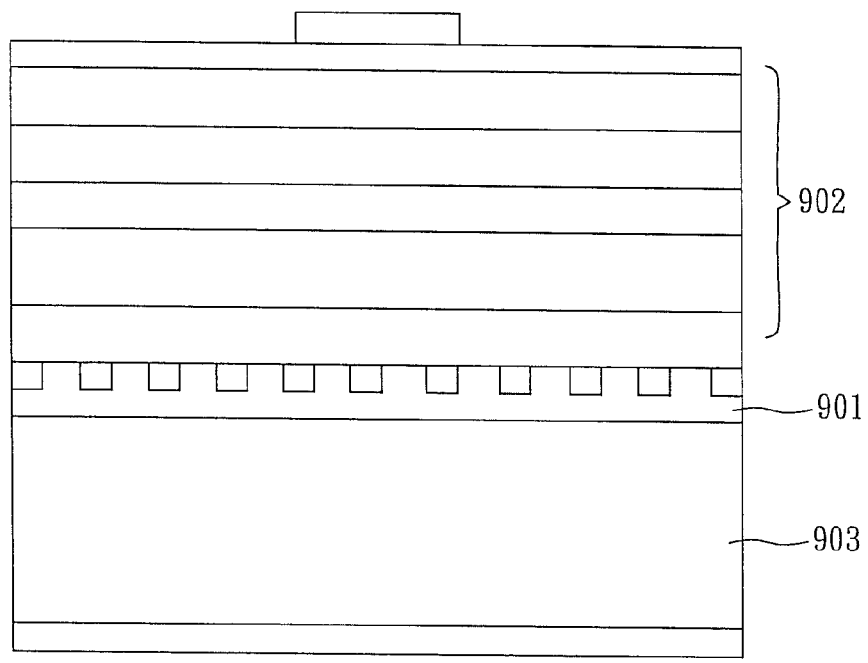
FIG. 2 is a schematic view of another conventional LED apparatus.
Figure 3:
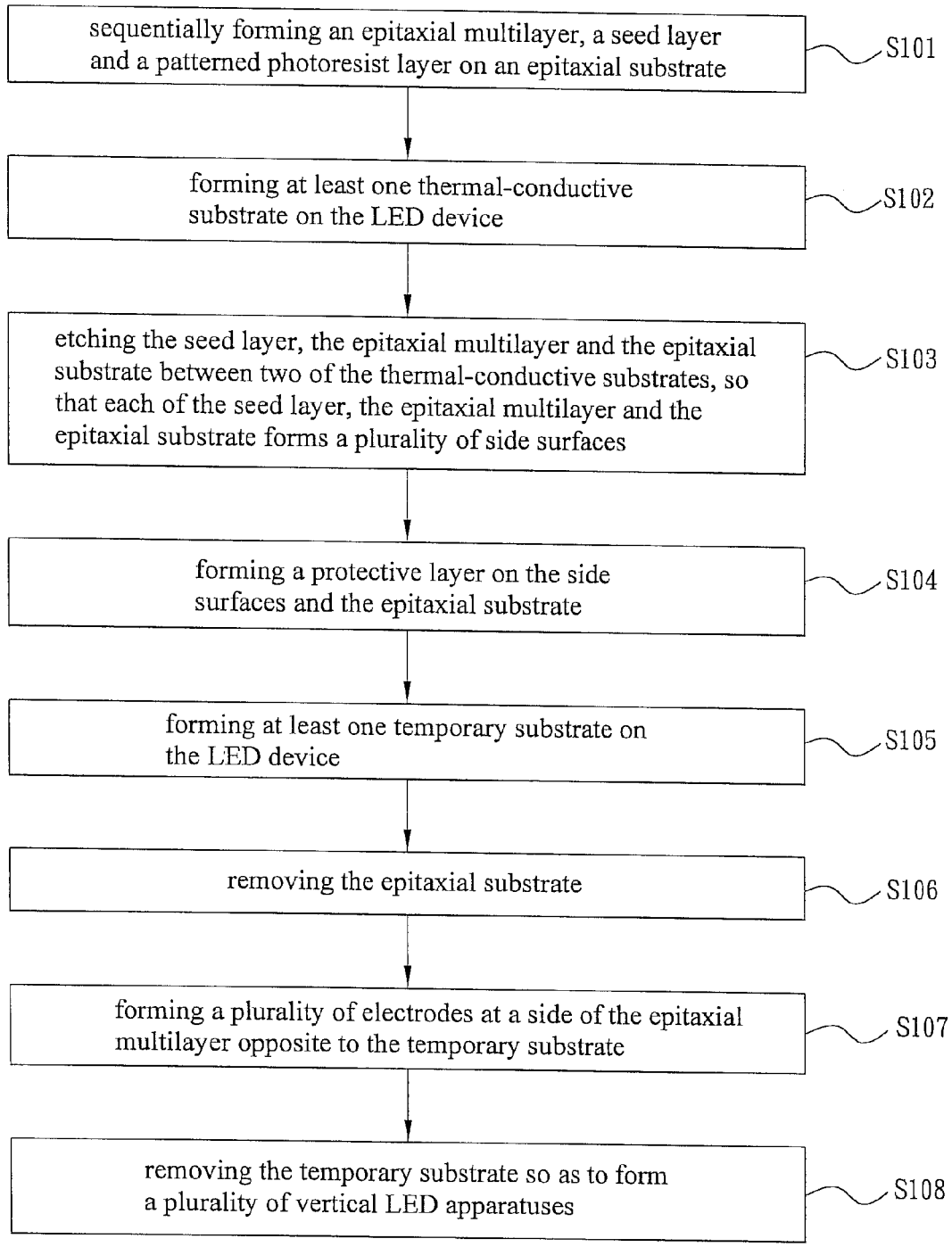
FIG. 3 is a flow chart of a manufacturing method of a plurality of LED apparatuses according to a first embodiment of the invention.

With reference to FIG. 3, a manufacturing method of a plurality of LED apparatuses 4 according to a first embodiment of the invention includes the following steps S101 to S108. The detailed illustrations of the manufacturing method will be described herein below with reference to FIGS. 4A to 4H.

Figure 4A:
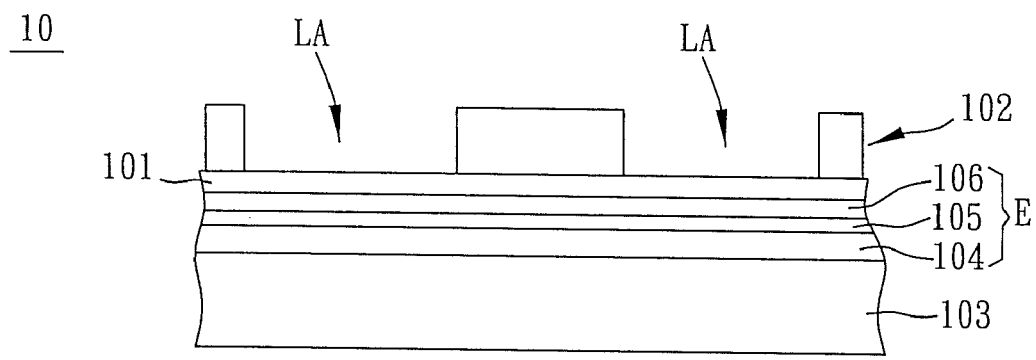
FIGS. 4A to 4H are schematic illustrations showing the LED apparatuses manufactured by the manufacturing method according to the first embodiment of the invention.

As shown in FIG. 4A, in step S101, an epitaxial multilayer E, a seed layer 101 and a patterned photoresist layer 102 are in sequence formed on an epitaxial substrate 103, thereby forming a LED device 10. The epitaxial multilayer E includes a first semiconductor layer 104, a light emitting layer 105 and a second semiconductor layer 106. The first semiconductor layer 104 is formed on the epitaxial substrate 103, the light emitting layer 105 is formed on the first semiconductor layer 104, and then the second semiconductor layer 106 is formed on the light emitting layer 105. The seed layer 101 is formed on the second semiconductor layer 106, and the patterned photoresist layer 102 is formed on the seed layer 101. The patterned photoresist layer 102 has a plurality of limiting areas LA.

In this embodiment, the first semiconductor layer 104 and the second semiconductor layer 106 are, respectively, an N-type epitaxial layer and a P-type epitaxial layer. Of course, the first semiconductor layer 104 and the second semiconductor layer 106 can be, respectively, a P-type epitaxial layer and an N-type epitaxial layer. The seed layer 101 includes a reflective layer, an ohmic contact layer and/or a transparent conductive layer. A material of the reflective layer includes a dielectric material or metal, such as titanium (Ti), aluminum (Al), chromium (Cr), nickel (Ni), platinum (Pt), gold (Au), silver (Ag), chromium/gold (Cr/Au), nickel/gold (Ni/Au), palladium (Pd), titanium/gold (Ti/Au), titanium/silver (Ti/Ag), chromium/platinum/gold (Cr/Pt/Au), an alloy thereof, a multi-metal layer thereof or a combination thereof, wherein chromium/gold (Cr/Au), nickel/gold (Ni/Au), titanium/gold (Ti/Au), titanium/silver (Ti/Ag) or chromium/platinum/gold (Cr/Pt/Au) is an alloy or a multi-metal layer. Take A/B for example. When A/B is a two-metal layer, A is a first metal layer, and B is a second metal layer. When A/B/C is a three metal layer, A is a first metal layer and B is a second metal layer and C is a third metal layer. This concept is applied to all other embodiments of the present invention, and will not be described anymore. A material of the ohmic contact layer comprises nickel/gold (Ni/Au), indium tin oxide (ITO), titanium nitride (TiN), cadimium tin oxide (CTO), nickel oxide (NiO), indium zinc oxide (IZO) or aluminum doped zinc oxide (AZO).

Figure 4B:
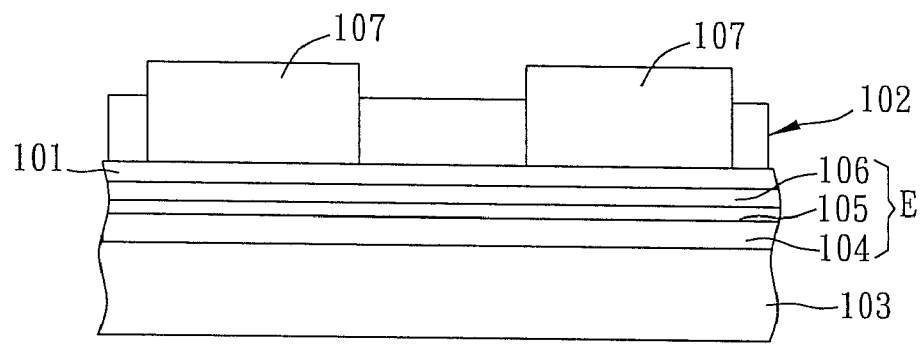

As shown in FIG. 4B, in step S 102, at least one thermal-conductive substrate 107 is formed on the LED device 10 of FIG. 4A. The thermal-conductive substrate 107 can be formed on the seed layer 101 by electrochemical deposition, electroforming or electroplating. The position of the thermal-conductive substrate 107 is defined by the limiting areas LA of the patterned photoresist layer 102. A material of the thermal-conductive substrate 107 includes a thermal-conductive metal, such as nickel. (Ni), copper (Cu), cobalt (Co), gold (Au) or aluminum (Al). To be noted, the thermal-conductive substrate 107 can be composed of a single material or be composed of multiple thermal-conductive metals and include a plurality of layers, such as three layers of Cu—Ni—Cu or Ni—Cu—Ni. The above examples are for illustrations only without limiting the scope of the invention, and any design capable of achieving good thermal conducting effect can be applied in this embodiment.

Figure 4C:
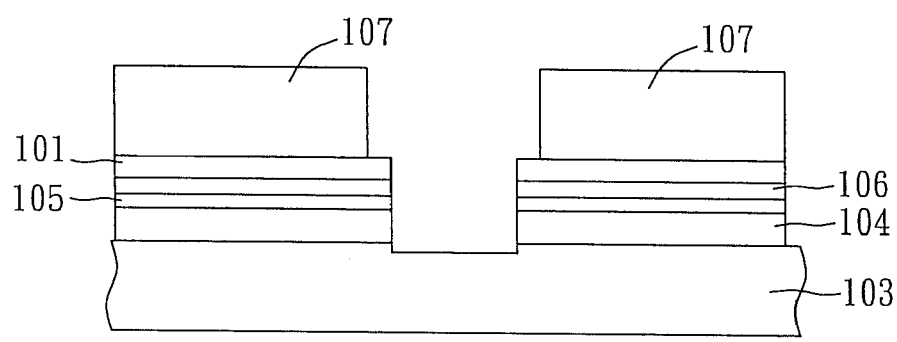

As shown in FIG. 4C, in step S103, the seed layer 101, the epitaxial multilayer E and the epitaxial substrate 103 between two of the thermal-conductive substrates are etched away, so that each of the seed layer 101, the epitaxial multilayer E and the epitaxial substrate 103 forms a plurality of side surfaces. In the step S103, the side surfaces can be formed by a photo process, photolithography process and an etching process, which may include the steps of forming, exposing, developing, etching and removing the photoresist. Herein, the etching step can be performed by a dry etching process or a wet etching process.

Figure 4D:
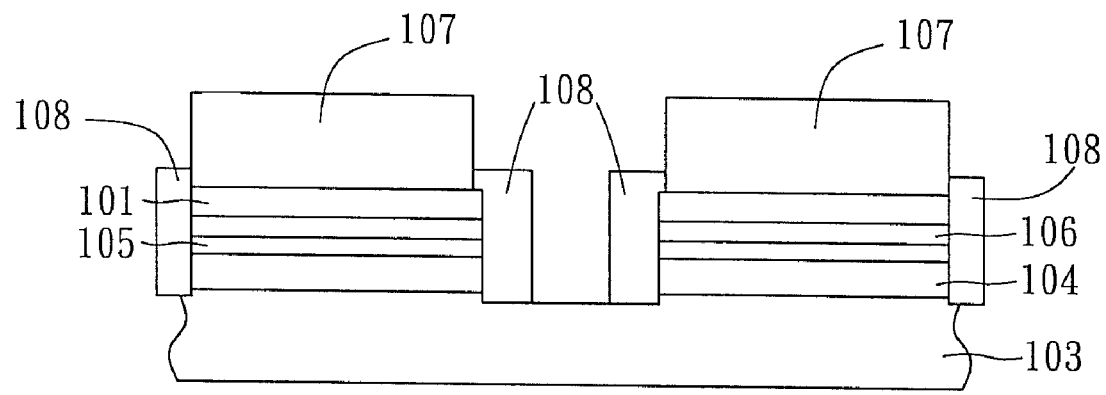

As shown in FIG. 4D, in step S104, a protective layer 108 is formed on the side surfaces of the epitaxial multilayer E or the side surfaces and the epitaxial substrate 103. A material of the protective layer 108 includes an insulating dielectric material such as an oxide, a nitride or a silicon carbide.

Figure 4E:
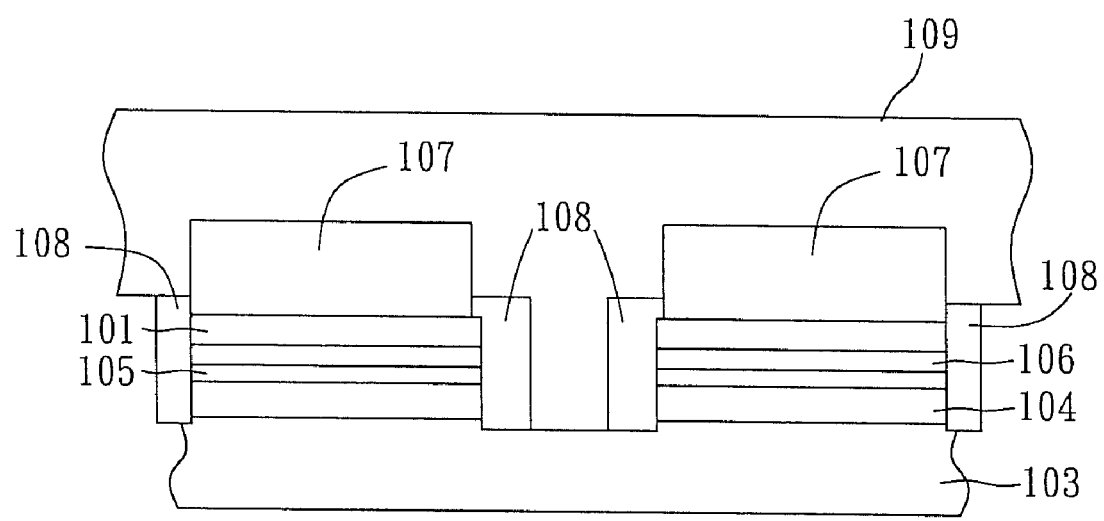

As shown in FIG. 4E, in step S105, at least one temporary substrate 109 is formed on the LED device. In the embodiment, the temporary substrate 109 covers the thermal-conductive substrate 107, and the protective layer 108 is disposed between the temporary substrate 109 and the epitaxial substrate 103. Herein, the LED device includes the epitaxial multilayer E and the epitaxial substrate 103 as shown in FIG. 4A.

A material of the temporary substrate 109 includes a curable material, such as photoresist, fluoro carbon rubber, fluoroelastomer, UV gel or instant adhesive. In this case, the step of forming the temporary substrate 109 includes the sub-steps of forming a curable material, and curing the curable material. The curable material can be formed by spin coating, screen printing, mesh printing or glue dispensing, and the curable material is cured by photo curing, thermal curing or cool curing. Alternatively, the curable material can be used as an adhesive layer for connecting the temporary substrate 109 and the thermal-conductive substrate 107, thereby forming a temporary substrate 109. That is, a temporary substrate is provided, and a curable material is formed between the temporary substrate and the LED device as an adhesive layer, and then the curable material is cured.

Figure 4F:
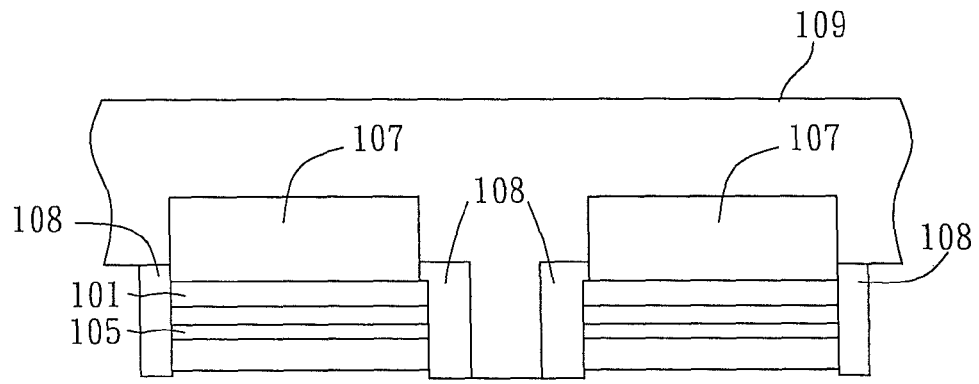
Figure 4G:
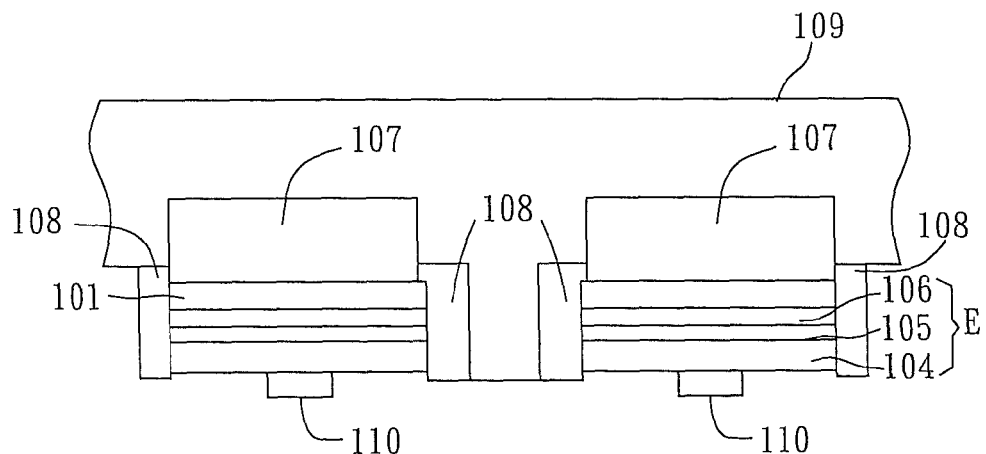
Figure 4H:
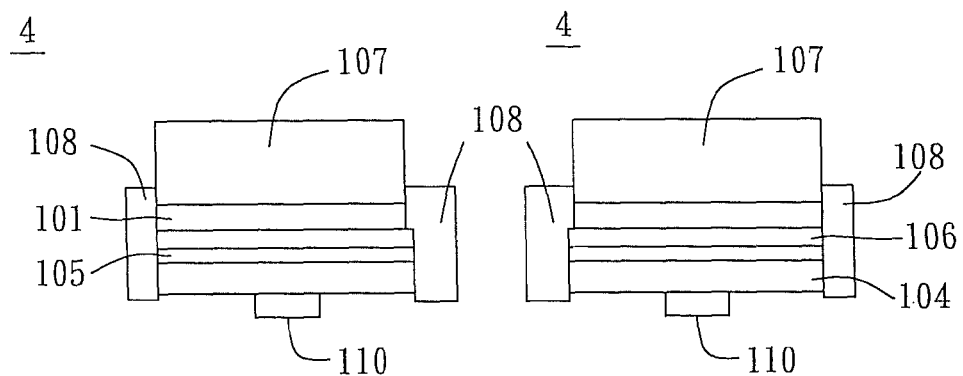

As shown in FIG. 4F, after forming the temporary substrate 109, the epitaxial substrate 103 is removed in step S106. In the embodiment, the epitaxial substrate 103 can be removed by laser lift-off, laser ablation, polishing or etching. In step S107, as shown in FIG. 4C, a plurality of electrodes 110 are formed at a side of the epitaxial multilayer E opposite to the temporary substrate 109. As shown in FIG. 4H, in step S108, the temporary substrate 109 is removed so as to form a plurality of vertical LED apparatuses 4.

Since the curable material has the properties of removable, expansible and extensible, the temporary substrate 109 can be removed easily by heating, water heating, UV light, chemical solution or organic solution. While the temporary substrate 109 is removed, the protective layer 108 disposed between two LED apparatuses is simultaneously removed. Accordingly, the LED devices are separated to form a plurality of LED apparatuses 4. Thus, the conventional dicing process is unnecessary, so that the problem of current leakage caused by the dicing process can be avoided. Moreover, the epitaxial multilayer E disposed aside the protective layer 108 can insulate electricity and thus prevent the current leakage.

It is to be specified that the above-mentioned steps are unnecessary to be performed in the order of the embodiment, and they can be switched depending on the actual needs of processing.

Second Embodiment

Figure 5:
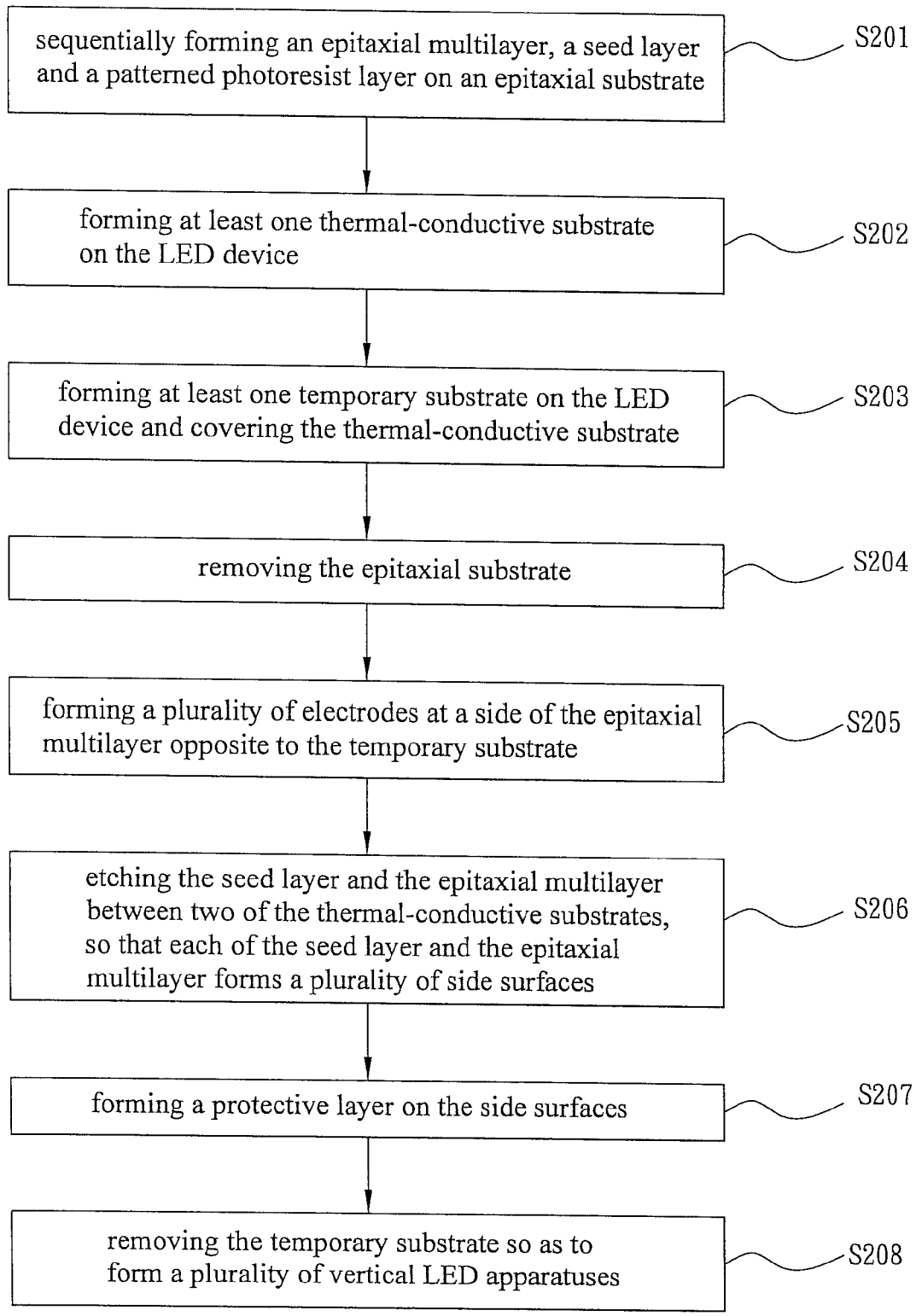
FIG. 5 is a flow chart of a manufacturing method of a plurality of LED apparatuses according to a second embodiment of the invention.

With reference to FIG. 5, a manufacturing method of a plurality of LED apparatuses 6 according to a second embodiment of the invention includes the following steps S201 to S208. The detailed illustrations of the manufacturing method will be described herein below with reference to FIGS. 6A to 6G.

Figure 6A:
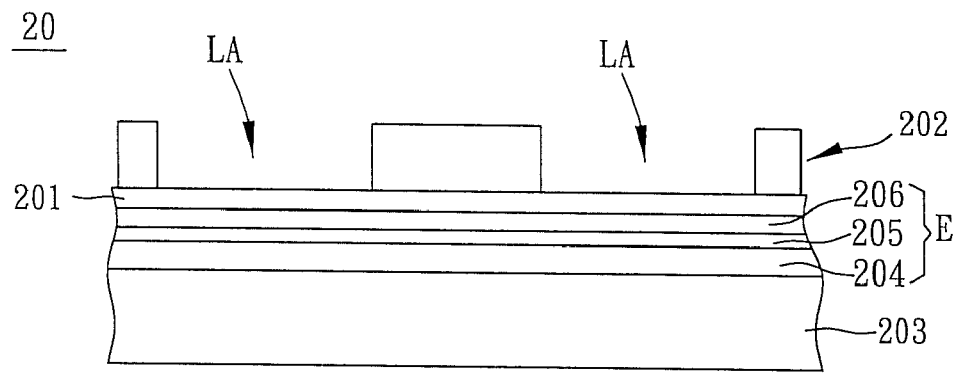
FIGS. 6A to 6G are schematic illustrations showing the LED apparatuses manufactured by the manufacturing method according to the second embodiment of the invention.

As shown in FIG. 6A, in step S201, an epitaxial multilayer E, a seed layer 201 and a patterned photoresist layer 202 are in sequence formed on an epitaxial substrate 203, thereby forming a LED device 20. The epitaxial multilayer E includes a first semiconductor layer 204, a light emitting layer 205 and a second semiconductor layer 206. The first semiconductor layer 204 is formed on the epitaxial substrate 203, the light emitting layer 205 is formed on the first semiconductor layer 204, and then the second semiconductor layer 206 is formed on the light emitting layer 205. The seed layer 201 is formed on the second semiconductor layer 206, and the patterned photoresist layer 202 is formed on the seed layer 201. The patterned photoresist layer 202 has a plurality of limiting areas LA. The epitaxial multilayer E, seed layer 201 and patterned photoresist layer 202 of the second embodiment are the same as the epitaxial multilayer E, seed layer 101 and patterned photoresist layer 102 of the first embodiment, so the detailed descriptions are omitted.

Figure 6B:
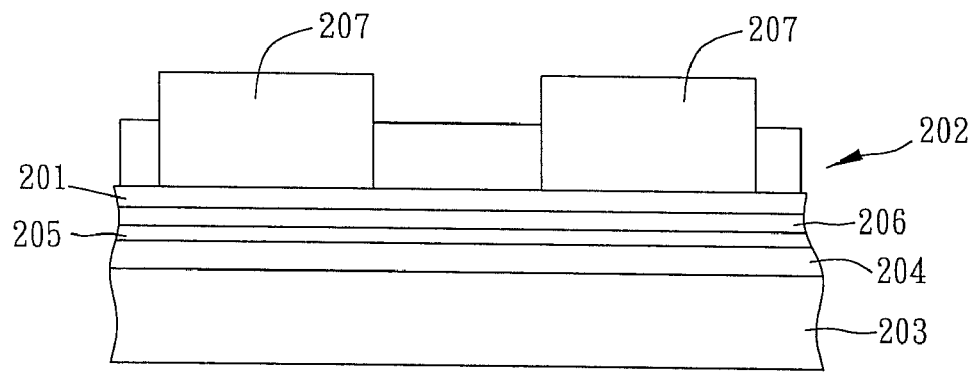

As shown in FIG. 6B, in step S202, at least one thermal-conductive substrate 207 is formed on the LED device 20. The thermal-conductive substrate 207 can be formed on the seed layer 201 by electrochemical deposition, non-electroplating, electroforming or electroplating. The position of the thermal-conductive substrate 207 is defined by the limiting areas LA of the patterned photoresist layer 202. A material of the thermal-conductive substrate 207 includes a thermal-conductive metal, such as nickel (Ni), copper (Cu), cobalt (Co), gold (Au) or aluminum (Al). To be noted, the thermal-conductive substrate 207 can be composed of a single material or be composed of multiple thermal-conductive metals and include a plurality of layers, such as three layers of Cu—Ni—Cu or Ni—Cu—Ni. The above examples are for illustrations only without limiting the scope of the invention, and any design capable of achieving good thermal conducting effect can be applied in this embodiment.

Figure 6C:
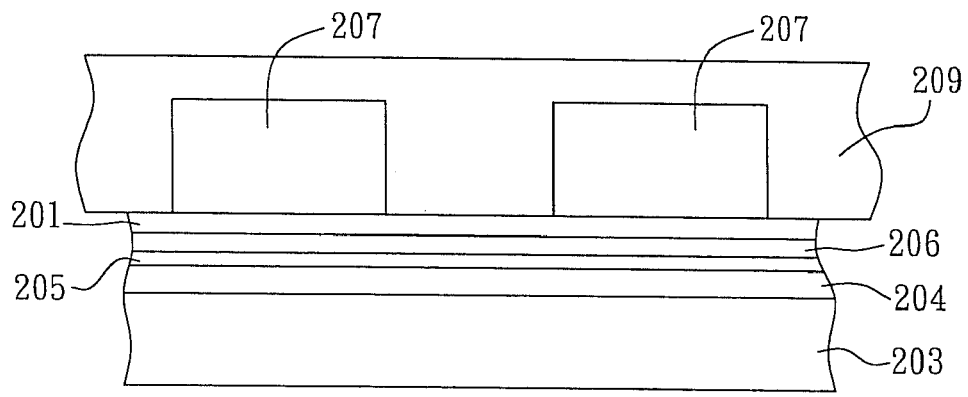

As shown in FIG. 6C, in step S203, at least one temporary substrate 209 is formed on the LED device. In the embodiment, the temporary substrate 209 covers the thermal-conductive substrates 207. The material and forming method of the temporary substrate 209 are the same as those of the temporary substrate 109 of the first embodiment, so the detailed descriptions are omitted. Alternatively, a temporary substrate is provided, and a curable material is formed between the temporary substrate and the LED device as an adhesive layer, and then the curable material is cured.

Figure 6D:
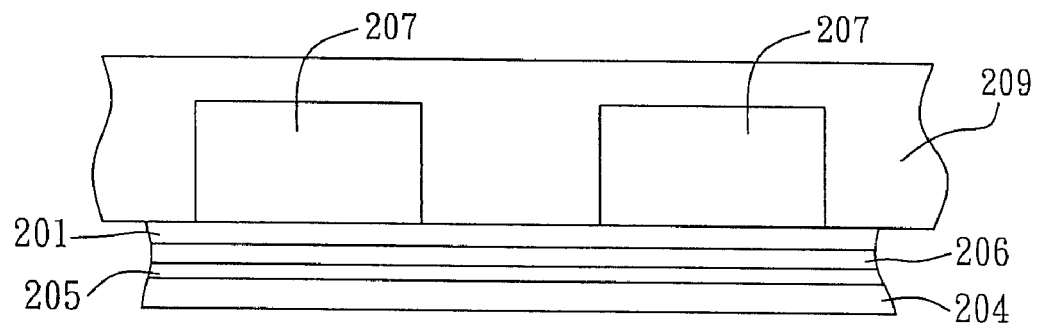
Figure 6E:
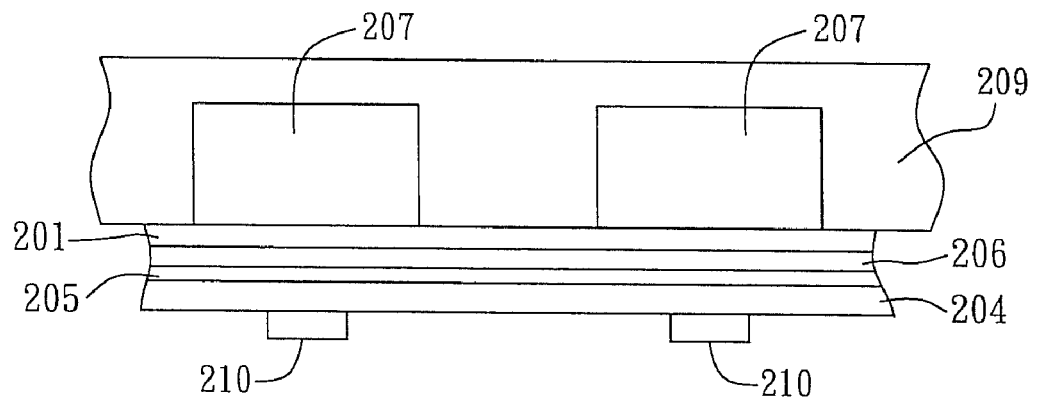
Figure 6F:
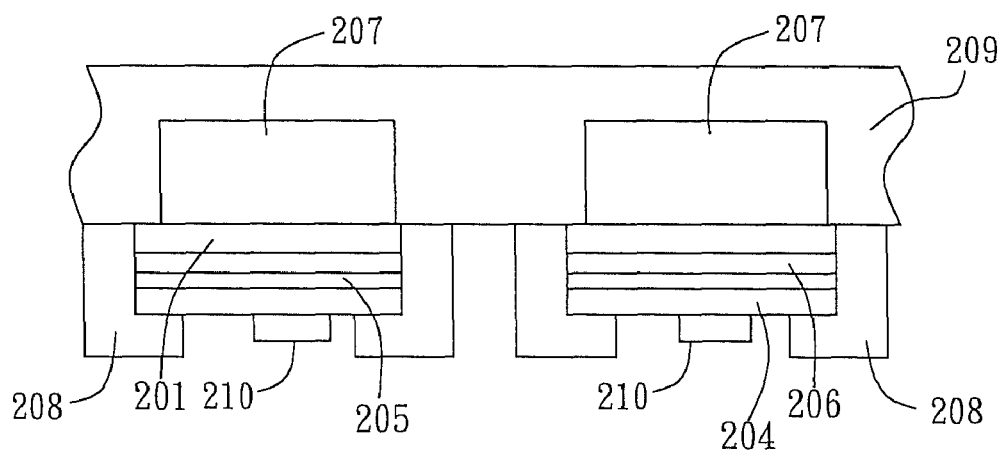

As shown in FIG. 6D, after forming the temporary substrate 209, the epitaxial substrate 203 is removed in step S204. In the embodiment, the epitaxial substrate 203 can be removed by laser lift-off, laser ablation, polishing or etching. In step S205, as shown in FIG. 6E, a plurality of electrodes 210 are formed at a side of the epitaxial multilayer E opposite to the temporary substrate 209. As shown in FIG. 6F, in step S206, the seed layer 201 and the epitaxial multilayer E between two of the thermal-conductive substrates 207 are etched, so that each of the seed layer 201 and the epitaxial multilayer E forms a plurality of side surfaces. After the etching step, a protective layer 208 is formed on the side surfaces in step S207. The etching step and the material of the protective layer 208 are the same as those of the first embodiment, so the detailed descriptions are omitted.

Figure 6G:
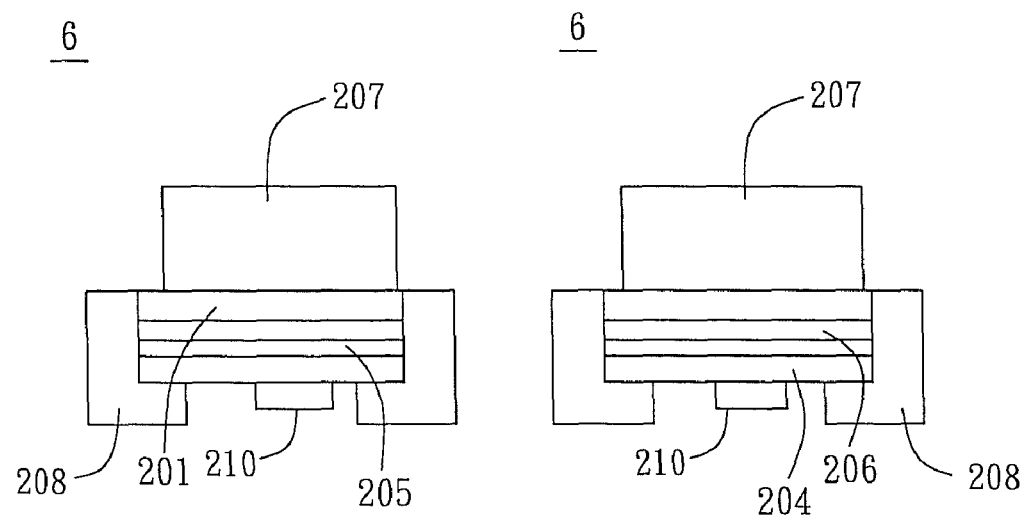

As shown in FIG. 6G, in step S208, the temporary substrate 209 is removed so as to form a plurality of vertical LED apparatuses 6. Since the curable material has the properties of removable, expansible and extensible, the temporary substrate 209 can be removed easily by heating, water heating, UV light, chemical solution or organic solution.

It is to be specified that the above-mentioned steps are unnecessary to be performed in the order of the embodiment, and they can be switched depending on the actual needs of processing.

Third Embodiment

Figure 7:
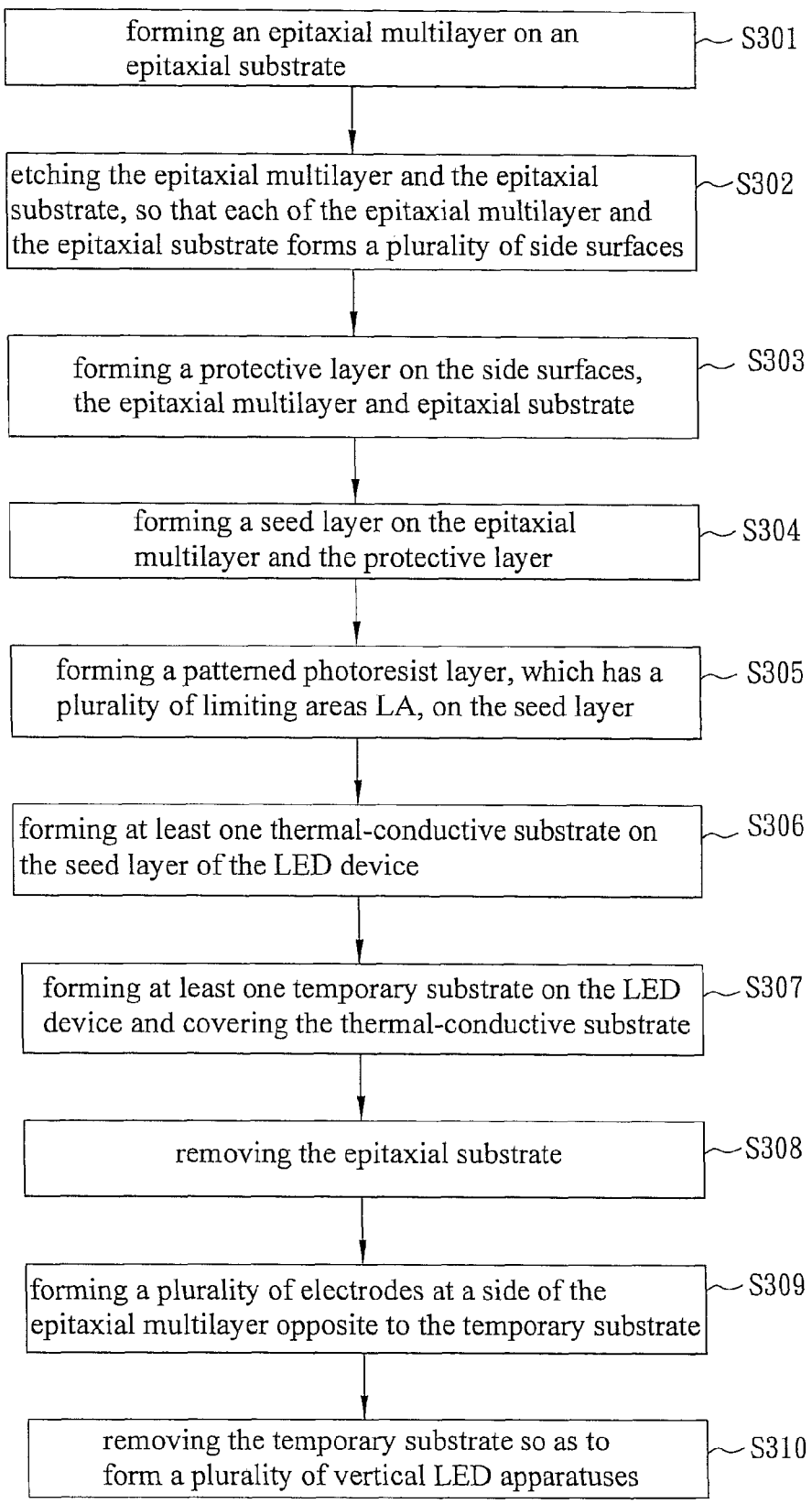
FIG. 7 is a flow chart of a manufacturing method of a plurality of LED apparatuses according to a third embodiment of the invention.

With reference to FIG. 7, a manufacturing method of a plurality of LED apparatuses 8 according to a third embodiment of the invention includes the following steps S301 to S310. The detailed illustrations of the manufacturing method will be described herein below with reference to FIGS. 8A to 8J.

Figure 8A:
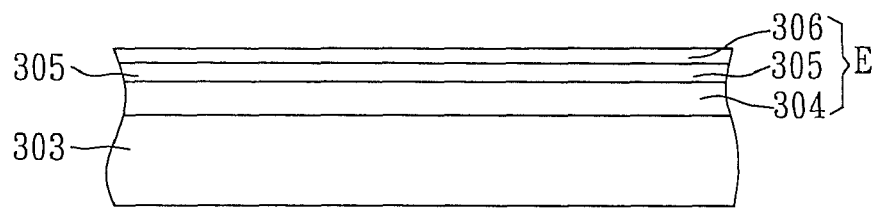
FIGS. 8A to 8J are schematic illustrations showing the LED apparatuses manufactured by the manufacturing method according to the third embodiment of the invention.

As shown in FIG. 8A, in step S301, an epitaxial multilayer E is formed on an epitaxial substrate 303. The epitaxial multilayer E includes a first semiconductor layer 304, a light emitting layer 305 and a second semiconductor layer 306. The first semiconductor layer 304 is formed on the epitaxial substrate 303, the light emitting layer 305 is formed on the first semiconductor layer 304, and then the second semiconductor layer 306 is formed on the light emitting layer 305.

Figure 8B:
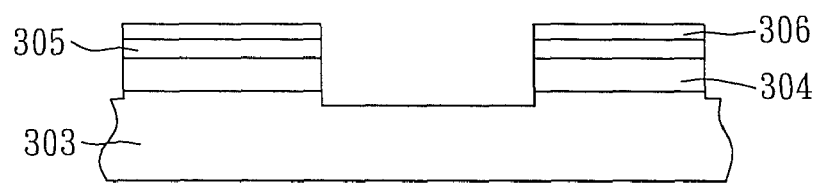

After the epitaxial multilayer E is formed, as shown in FIG. 8B, the epitaxial multilayer E and the epitaxial substrate 303 are etched, so that each of the epitaxial multilayer E and the epitaxial substrate 303 forms a plurality of side surfaces in step S302. Alternatively, the epitaxial multilayer E is etched until to the epitaxial substrate 303, so that the epitaxial multilayer E forms a plurality of side surfaces in step S302. In this embodiment, the etching process can be a dry etching process or a wet etching process.

Figure 8C:
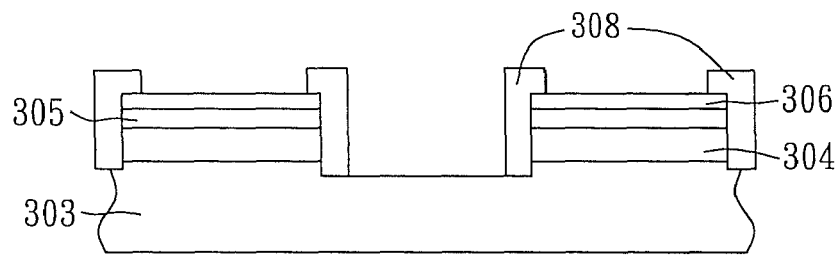

As shown in FIG. 8C, a protective layer 308 is formed on the side surfaces of the epitaxial multilayer E or the side surfaces and epitaxial substrate 303 in step S303. The material of the protective layer 308 is the same as that of the protective layer 108 of the first embodiment, so the detailed descriptions are omitted.

Figure 8D:
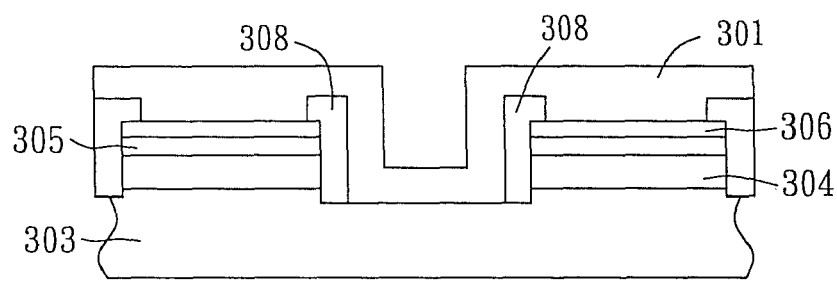

After forming the protective layer 308, as shown in FIG. 8D, a seed layer 301 is formed on the epitaxial multilayer E and the protective layer 308 in step S304. The material of the seed layer 301 is the same as that of the seed layer 101 of the first embodiment, so the detailed descriptions are omitted.

Figure 8E:
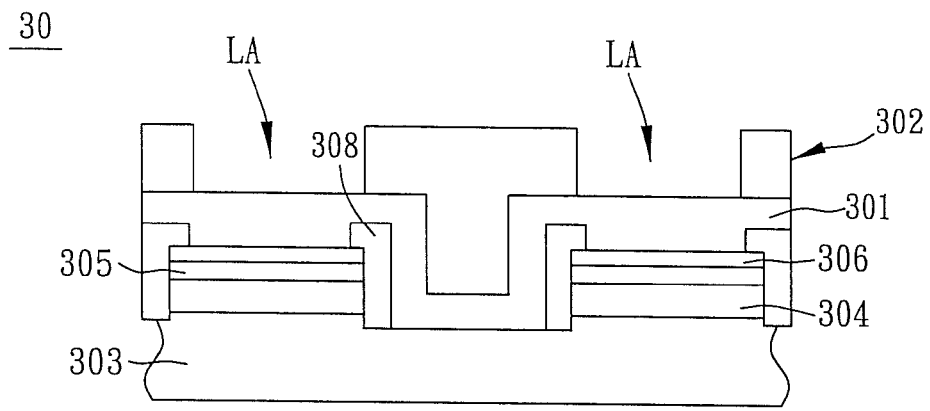

After forming the seed layer 301, as shown in FIG. 8E, a patterned photoresist layer 302 is formed on the seed layer 301 in step S305. The patterned photoresist layer 302 has a plurality of limiting areas LA for forming a plurality of LED devices 30, respectively.

Figure 8F:
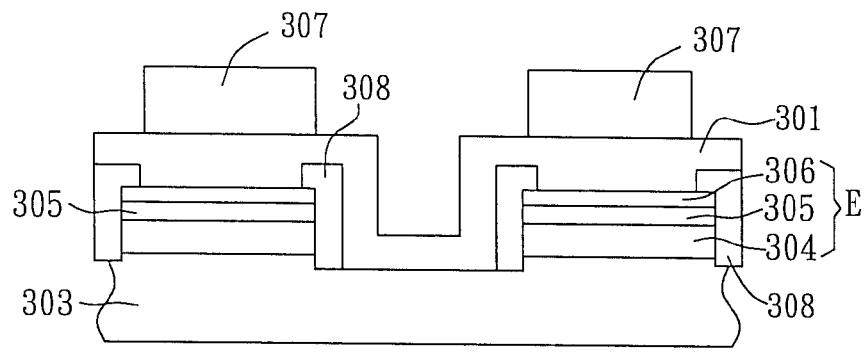

As shown in FIG. 8F, in step S306, at least one thermal-conductive substrate 307 is formed on the LED device 30. The thermal-conductive substrate 307 can be formed on the seed layer 301 by electrochemical deposition, non-electroplating, electroforming or electroplating. The position of the thermal-conductive substrate 307 is defined by the limiting areas LA of the patterned photoresist layer 302. A material of the thermal-conductive substrate 307 includes a thermal-conductive metal, such as nickel (Ni), copper (Cu), cobalt (Co), gold (Au) or aluminum (Al). To be noted, the thermal-conductive substrate 307 can be composed of a single material or be composed of multiple thermal-conductive metals and include a plurality of layers, such as three layers of Cu—Ni—Cu or Ni—Cu—Ni. The above examples are for illustrations only without limiting the scope of the invention, and any design capable of achieving good thermal conducting effect can be applied in this embodiment.

Figure 8G:
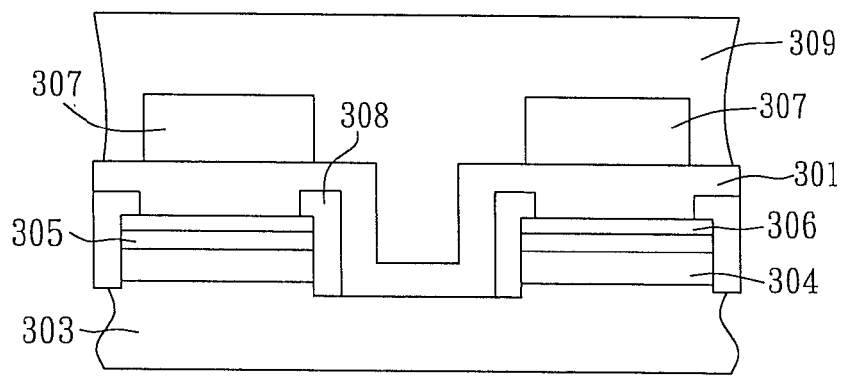

As shown in FIG. 8G, after forming the thermal-conductive substrate 307, at least one temporary substrate 309 is formed on the LED device 30 in step S307. In the embodiment, the temporary substrate 309 covers the thermal-conductive substrate 307. Alternatively, a temporary substrate is provided, and a curable material is formed between the temporary substrate and the LED device as an adhesive layer, and then the curable material is cured. The material and forming method of the temporary substrate 309 are the same as those of the temporary substrate 109 of the first embodiment, so the detailed descriptions are omitted.

Figure 8H:
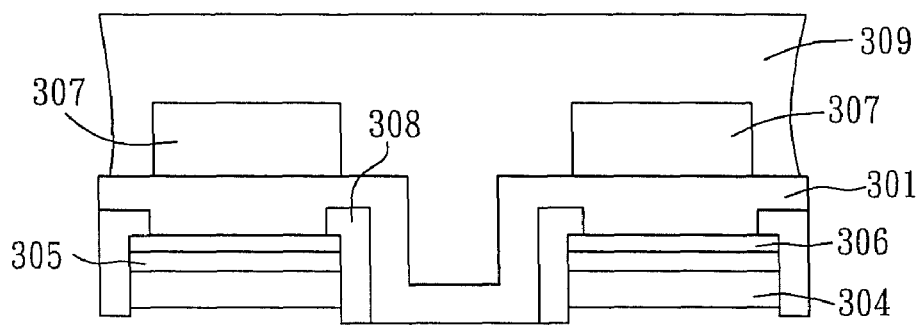
Figure 8I:
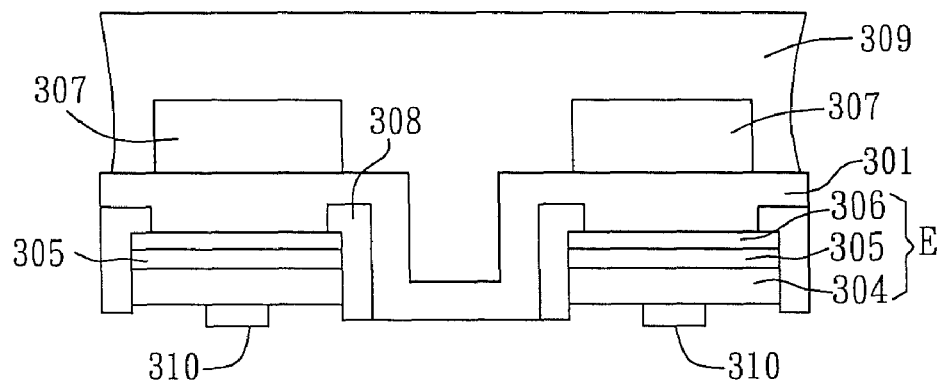
Figure 8J:
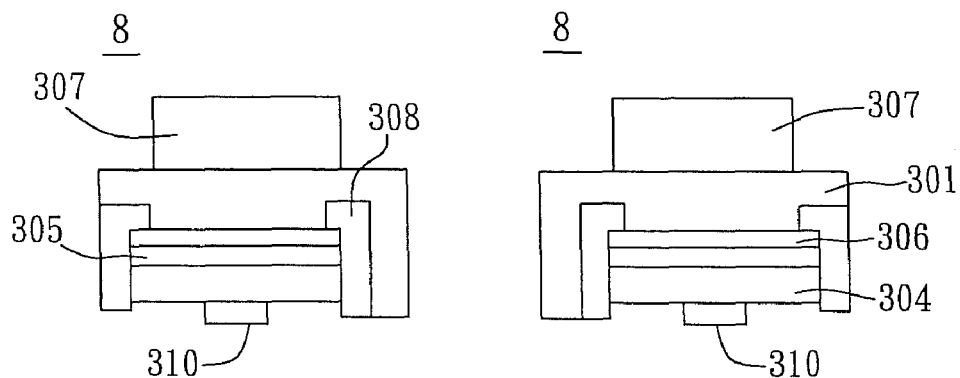

As shown in FIG. 8H, the epitaxial substrate 303 is removed in step S308. In the embodiment, the epitaxial substrate 303 can be removed by laser lift-off, laser ablation, polishing or etching. In step S309, as shown in FIG. 8I, a plurality of electrodes 310 are formed at a side of the epitaxial multilayer E opposite to the temporary substrate 309 after the epitaxial substrate 303 is removed. As shown in FIG. 8J, in step S310, the temporary substrate 309 is removed so as to form a plurality of vertical LED apparatuses 8.

Since the curable material has the properties of removable, expansible and extensible, the temporary substrate 309 can be removed easily by heating, water heating, UV light, chemical solution or organic solution. While the temporary substrate 309 is removed, the protective layer 308 and the seed layer 301 disposed between two LED apparatuses 8 are simultaneously removed. Accordingly, the LED devices 30 are separated to form a plurality of LED apparatuses 8.

It is to be specified that the above-mentioned steps are unnecessary to be performed in the order of the embodiment, and they can be switched depending on the actual needs of processing.

Fourth Embodiment

Figure 9:
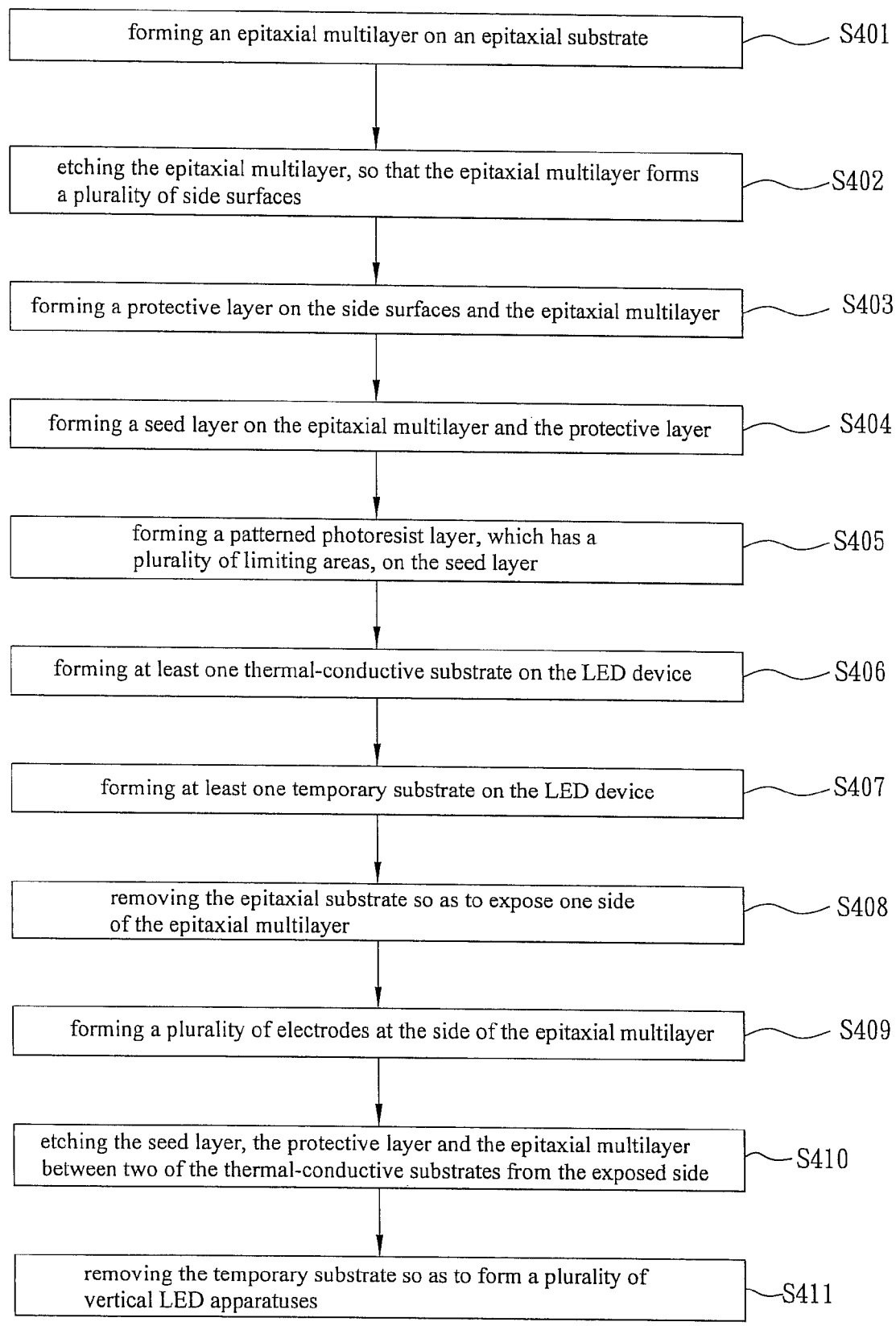
FIG. 9 is a flow chart of a manufacturing method of a plurality of LED apparatuses according to a fourth embodiment of the invention.

With reference to FIG. 9, a manufacturing method of a plurality of LED apparatuses according to a fourth embodiment of the invention includes the following steps S401 to S411. The detailed illustrations of the manufacturing method will be described herein below with reference to FIGS. 10A to 10K.

Figure 10A:
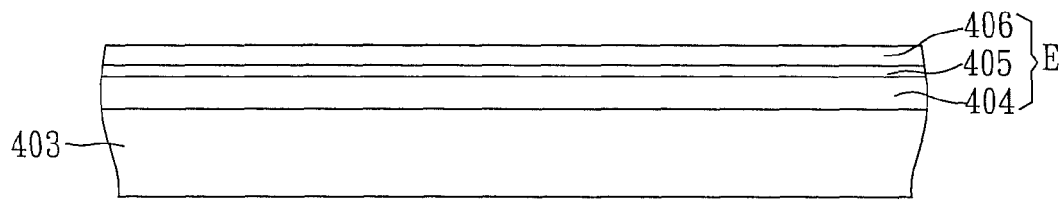
FIGS. 10A to 10K are schematic illustrations showing the LED apparatuses manufactured by the manufacturing method according to the fourth embodiment of the invention.

As shown in FIG. 10A, in step S401, an epitaxial multilayer E is formed on an epitaxial substrate 403. The epitaxial multilayer E includes a first semiconductor layer 404, a light emitting layer 405 and a second semiconductor layer 406. The first semiconductor layer 404 is formed on the epitaxial substrate 403, the light emitting layer 405 is formed on the first semiconductor layer 404, and then the second semiconductor layer 406 is formed on the light emitting layer 405.

Figure 10B:
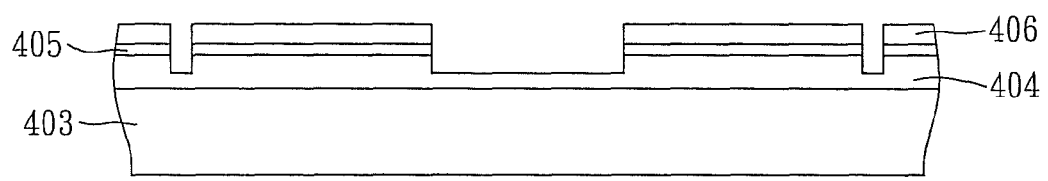
Figure 10C:
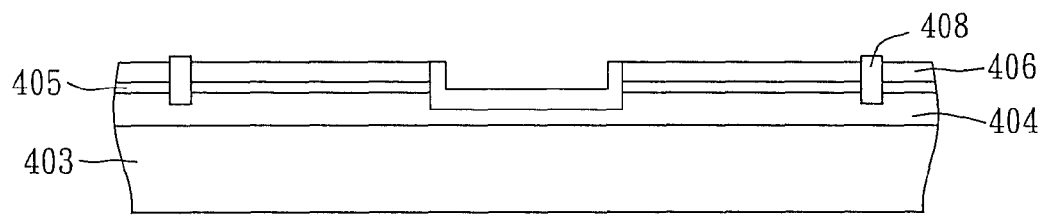

As shown in FIG. 10B, the epitaxial multilayer E is etched in step S402, so that the epitaxial multilayer E forms a plurality of side surfaces. In this embodiment, the etching process can be a dry etching process or a wet etching process. As shown in FIG. 10C, a protective layer 408 is formed on the side surfaces and the epitaxial multilayer E in step S403. The material of the protective layer 408 is the same as that of the protective layer 108 of the first embodiment, so the detailed descriptions are omitted.

Figure 10D:
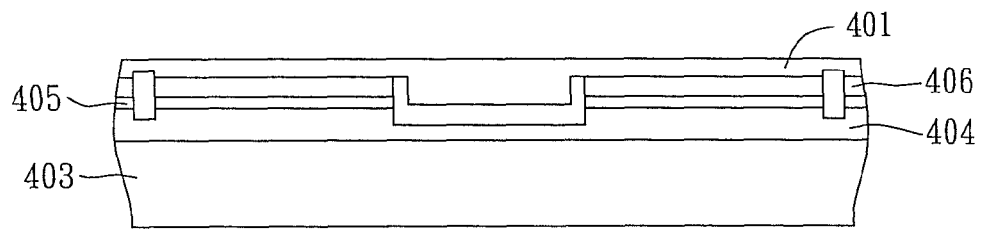
Figure 10E:
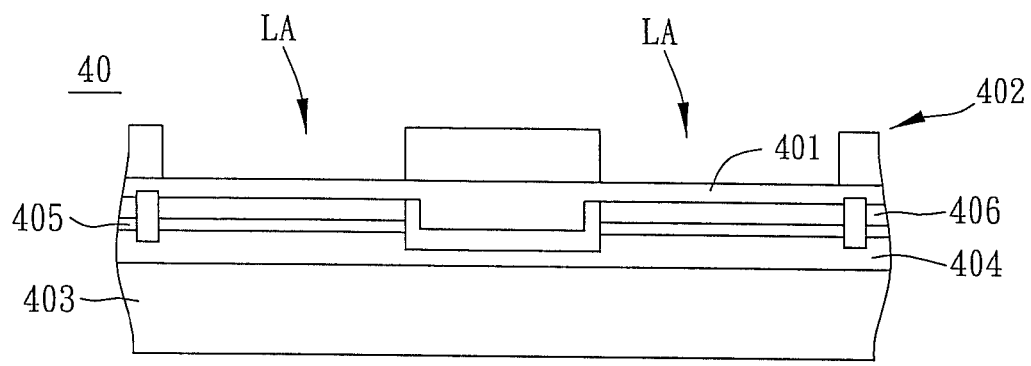

After forming the protective layer 408, as shown in FIG. 10D, a seed layer 401 is formed on the epitaxial multilayer E and the protective layer 408 in step S404. The material of the seed layer 401 is the same as that of the seed layer 101 of the first embodiment, so the detailed descriptions are omitted. After forming the seed layer 401, as shown in FIG. 10E, a patterned photoresist layer 402 is formed on the seed layer 401 in step S405. The patterned photoresist layer 402 has a plurality of limiting areas LA for forming a plurality of LED devices 40, respectively.

Figure 10F:
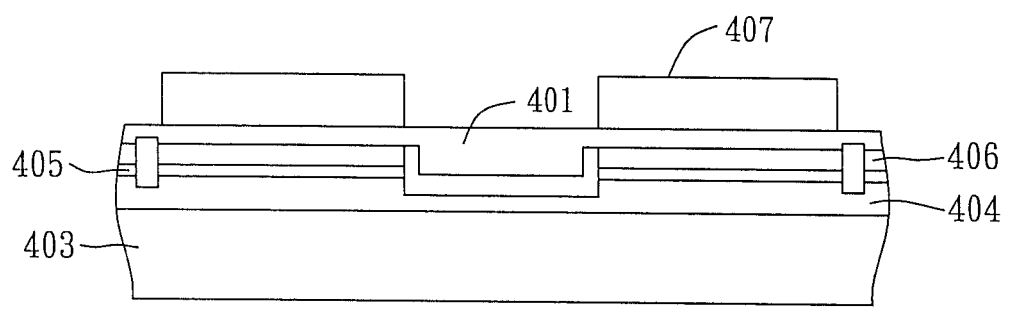
Figure 10G:
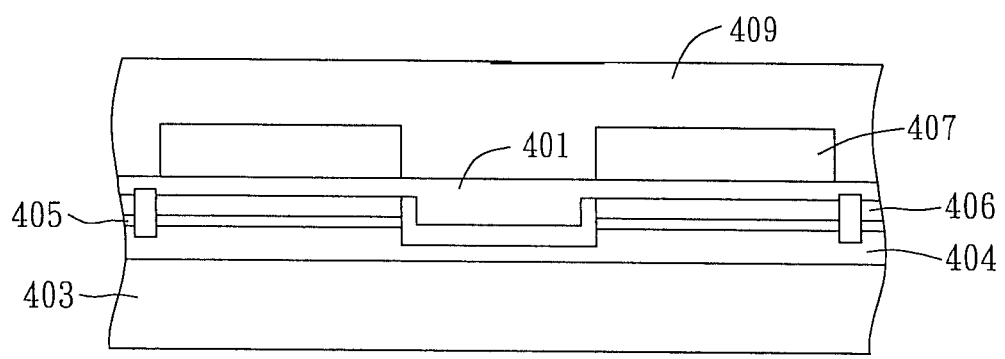

As shown in FIG. 10F, in step S406, at least one thermal-conductive substrate 407 is formed on the LED device 40. The thermal-conductive substrate 407 can be formed on the seed layer 401 by electrochemical deposition, non-electroplating, electroforming or electroplating. The position of the thermal-conductive substrate 407 is defined by the limiting areas LA of the patterned photoresist layer 402. A material of the thermal-conductive substrate 407 includes a thermal-conductive metal, such as nickel (Ni), copper (Cu), cobalt (Co), gold (Au) or aluminum (Al). To be noted, the thermal-conductive substrate 407 can be composed of a single material or be composed of multiple thermal-conductive metals and include a plurality of layers, such as three layers of Cu—Ni—Cu or Ni—Cu—Ni. The above examples are for illustrations only without limiting the scope of the invention, and any design capable of achieving good thermal conducting effect can be applied in this embodiment.

As shown in FIG. 10, after forming the thermal-conductive substrate 407, at least one temporary substrate 409 is formed on the LED device 40 in step S407. In the embodiment, the temporary substrate 409 covers the thermal-conductive substrate 407. Alternatively, a temporary substrate is provided, and a curable material is formed between the temporary substrate and the LED device as an adhesive layer, and then the curable material is cured. The material and forming method of the temporary substrate 409 are the same as those of the temporary substrate 109 of the first embodiment, so the detailed descriptions are omitted.

Figure 10H:
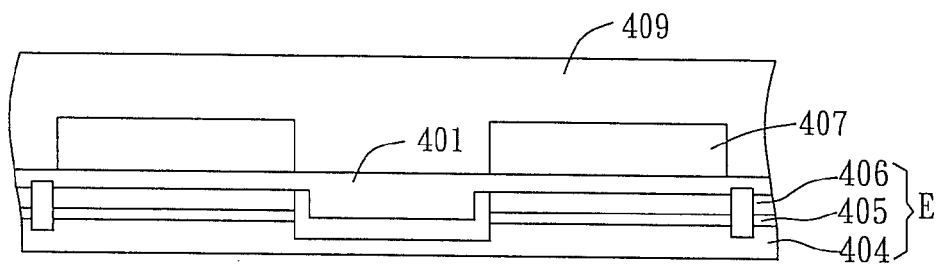
Figure 10I:
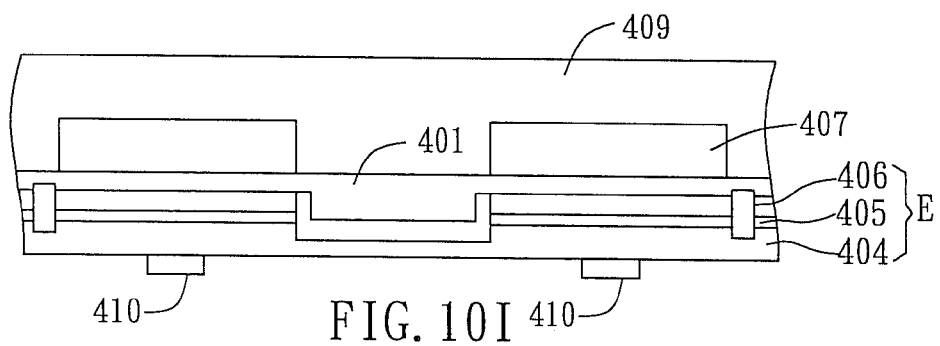
Figure 10J:
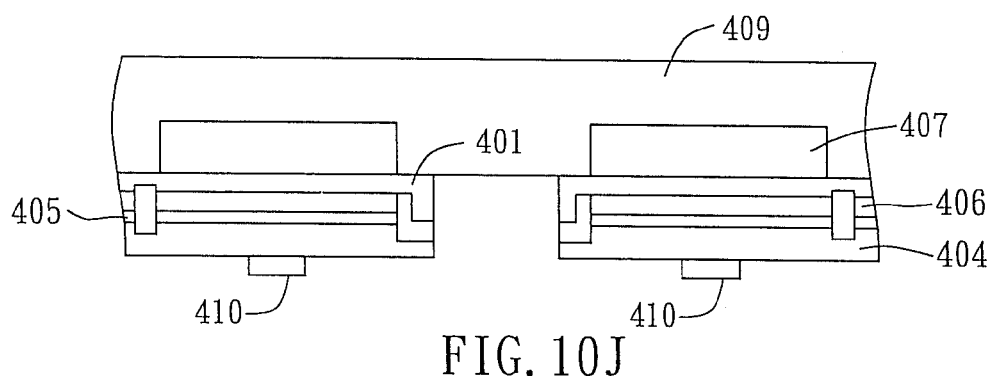

As shown in FIG. 10H, the epitaxial substrate 403 is removed in step S408 so as to expose one side of the epitaxial multilayer E. In the embodiment, the epitaxial substrate 403 can be removed by laser lift-off, laser ablation, polishing or etching. In step S409, as shown in FIG. 10I, a plurality of electrodes 410 are formed at the side of the epitaxial multilayer E after the epitaxial substrate 403 is removed. As shown in FIG. 10J, in step S410, the seed layer 401, the protective layer 408 and the epitaxial multilayer E between two of the thermal-conductive substrates 407 are etched from the exposed side.

Figure 10K:
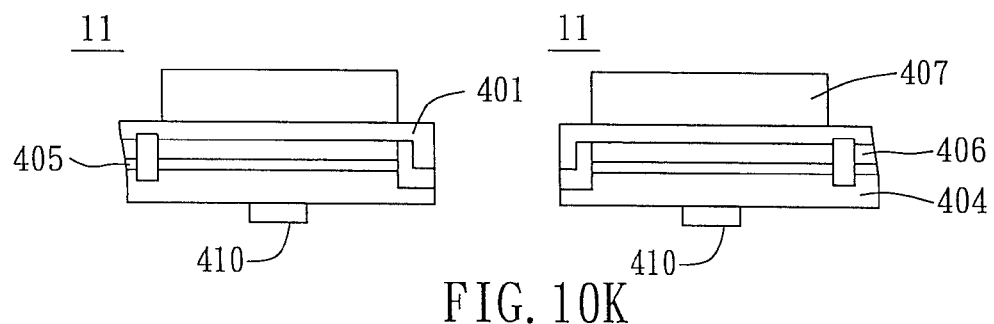

As shown in FIG. 10K, in step S411, the temporary substrate 409 is removed so as to form a plurality of vertical LED apparatuses 11. Since the curable material has the properties of removable, expansible and extensible, the temporary substrate 409 can be removed easily by heating, water heating, UV light, chemical solution or organic solution.

It is to be specified that the above-mentioned steps are unnecessary to be performed in the order of the embodiment, and they can be switched depending on the actual needs of processing.

Fifth Embodiment

Figure 11:
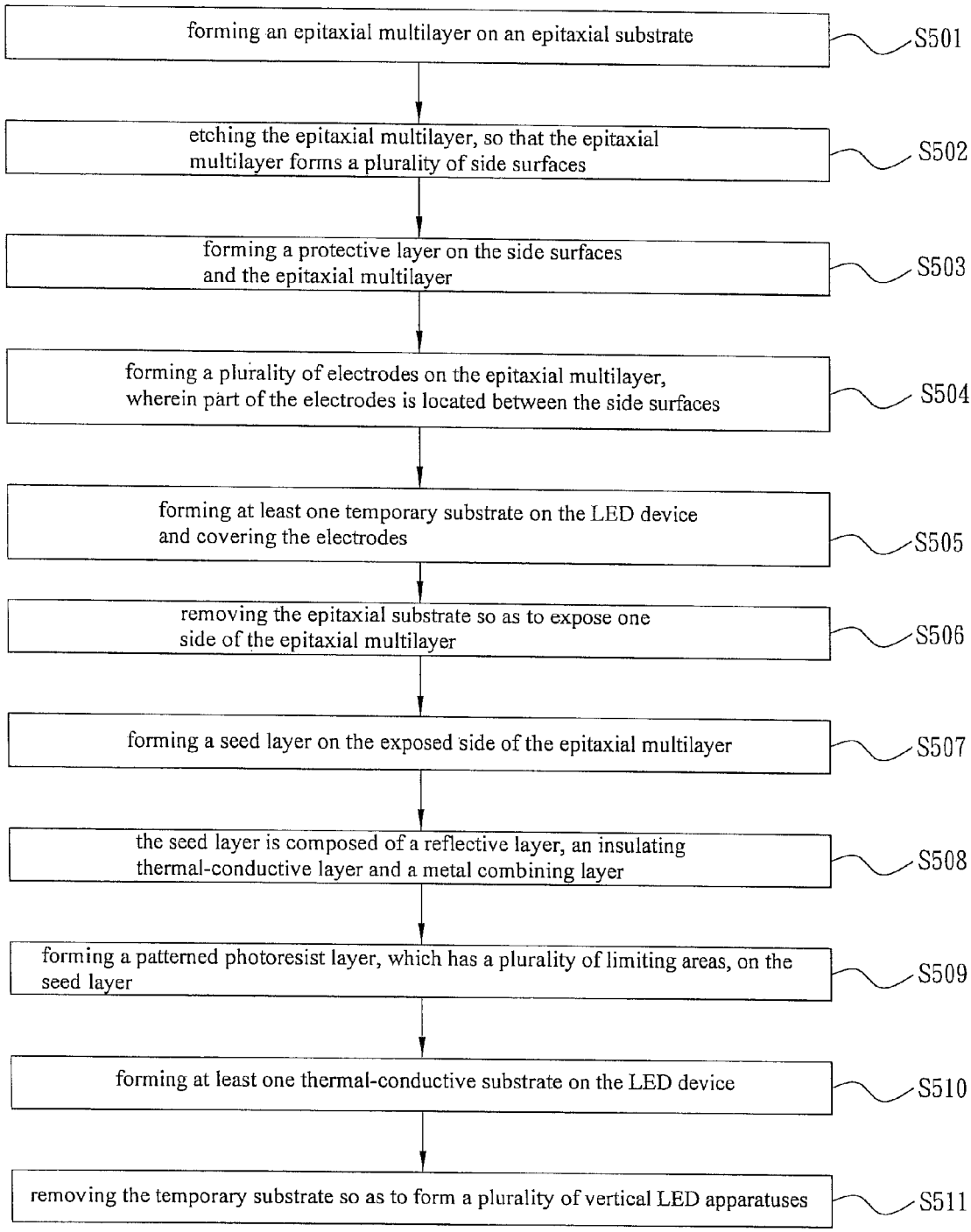
FIG. 11 is a flow chart of a manufacturing method of a plurality of LED apparatuses according to a fifth embodiment of the invention.

With reference to FIG. 11, a manufacturing method of a plurality of LED apparatuses 12 according to a fifth embodiment of the invention includes the following steps S501 to S511. The detailed illustrations of the manufacturing method will be described herein below with reference to FIGS. 12A to 12J.

Figure 12A:
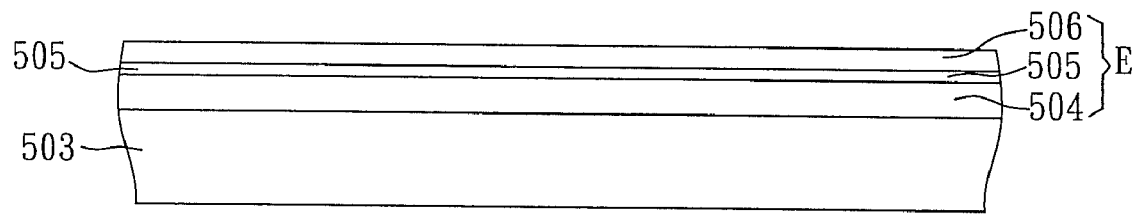
FIGS. 12A to 12J are schematic illustrations showing the LED apparatuses manufactured by the manufacturing method according to the fifth embodiment of the invention.

As shown in FIG. 12A, in step S501, an epitaxial multilayer E is formed on an epitaxial substrate 503. The epitaxial multilayer E includes a first semiconductor layer 504, a light emitting layer 505 and a second semiconductor layer 506. The first semiconductor layer 504 is formed on the epitaxial substrate 503, the light emitting layer 505 is formed on the first semiconductor layer 504, and then the second semiconductor layer 506 is formed on the light emitting layer 505.

Figure 12B:
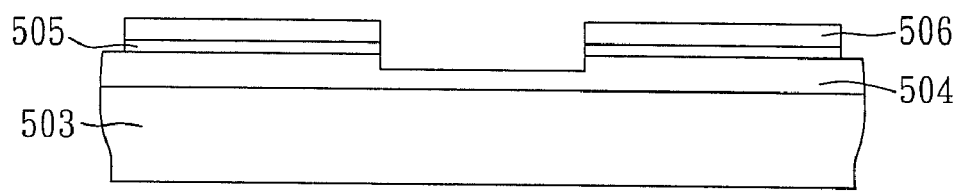
Figure 12C:
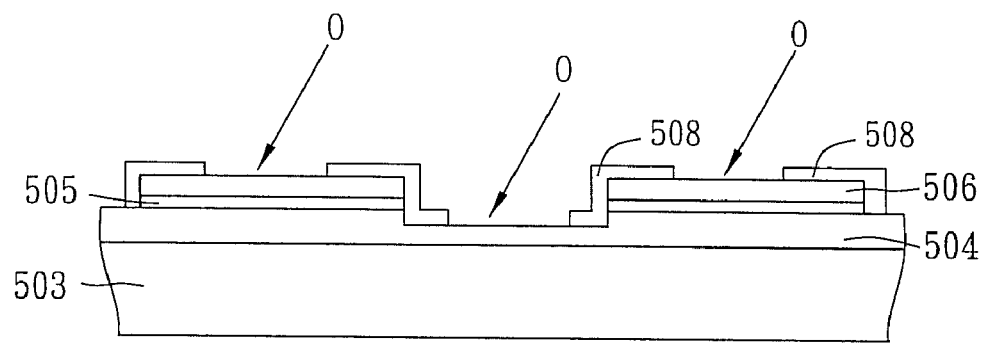
Figure 12D:
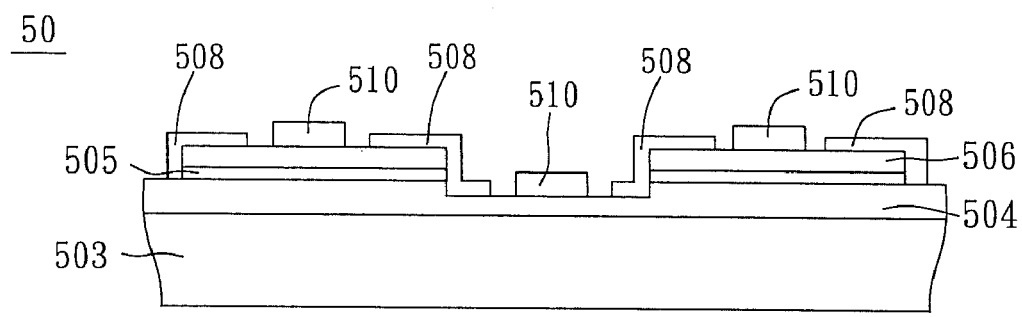

As shown in FIG. 12B, the epitaxial multilayer E is etched in step S502, so that the epitaxial multilayer E forms a plurality of side surfaces. In this embodiment, the etching process can be a dry etching process or a wet etching process. As shown in FIG. 12C, a protective layer 508 is formed on the side surfaces and the epitaxial multilayer E (including the first semiconductor layer 504 and the second semiconductor layer 506) in step S503. In this step S503, the protective layer 508 has an opening O for forming electrodes in the later step. The material of the protective layer 508 is the same as that of the protective layer 108 of the first embodiment such as an insulating dielectric material (e.g. oxide, nitride or silicon carbide). In step S504, as shown in FIG. 12D, a plurality of electrodes 510 are formed on the first semiconductor layer 504 and the second semiconductor layer 506 of the epitaxial multilayer E. Herein, part of the electrodes 510 is located between the side surfaces, thereby forming the structure of a LED device 50.

Figure 12E:
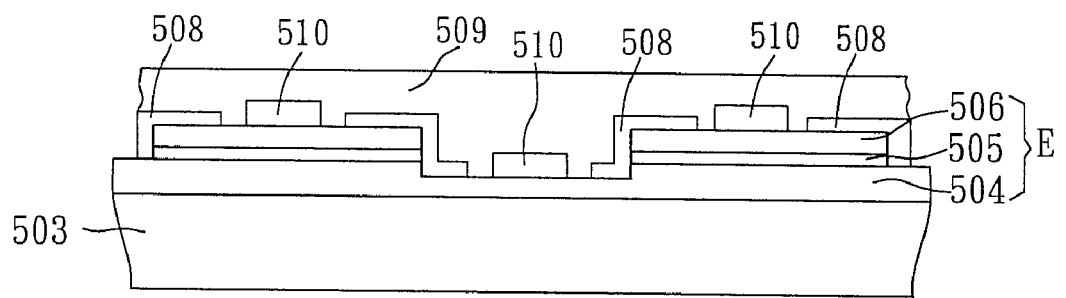

As shown in FIG. 12E, after forming the electrodes 510, at least one temporary substrate 509 is formed on the LED device 50 in step S505. In the embodiment, the temporary substrate 509 covers the electrodes 510. Alternatively, a temporary substrate is provided, and a curable material is formed between the temporary substrate and the LED device as an adhesive layer, and then the curable material is cured. The material and forming method of the temporary substrate 509 are the same as those of the temporary substrate 109 of the first embodiment, so the detailed descriptions are omitted.

Figure 12F:
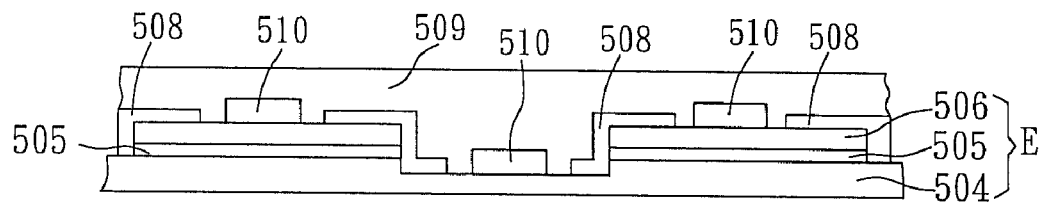

After forming the temporary substrate 509, as shown in FIG. 12F, the epitaxial substrate 503 is removed in step S506 so as to expose one side of the epitaxial multilayer E. In the embodiment, the first semiconductor layer 504 of the epitaxial multilayer E is exposed. Herein, the epitaxial substrate 503 can be removed by laser lift-off, laser ablation, polishing or etching.

Figure 12G:
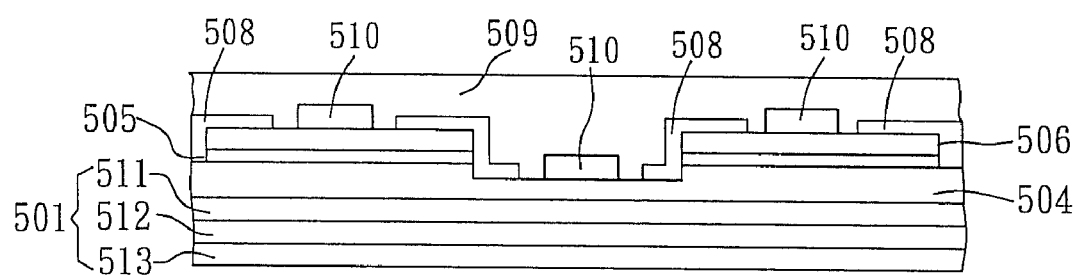

As shown in FIG. 12G, after the epitaxial substrate 503 is removed, a seed layer 501 is formed on the exposed side of the epitaxial multilayer E in step S507. In step S508, the seed layer 501 is composed of an insulating thermal-conductive layer 512 and a metal combining layer 513. To be noted, the seed layer 501 not only includes a reflective layer, an ohmic contact layer and/or a transparent conductive layer, as the seed layer 101 of the first embodiment, but also includes the insulating thermal-conductive layer 512 and the metal combining layer 513. In other words, the seed layer 501 is preferably composed of a reflective layer 511, an ohmic contact layer, an insulating thermal-conductive layer 512 and a metal combining layer 513. Alternatively, the seed layer 501 can be composed of an ohmic contact layer with the reflective function, an insulating thermal-conductive layer and a metal combining layer. The insulating thermal-conductive layer 512, which is made of, for example, aluminum nitride or silicon carbide, can help the LED apparatus to achieve better antistatic and insulation. A material of the metal combining layer 513 includes nickel (Ni), copper (Cu), cobalt (Co), gold (Au), aluminum (Al) or a combination thereof.

Figure 12H:
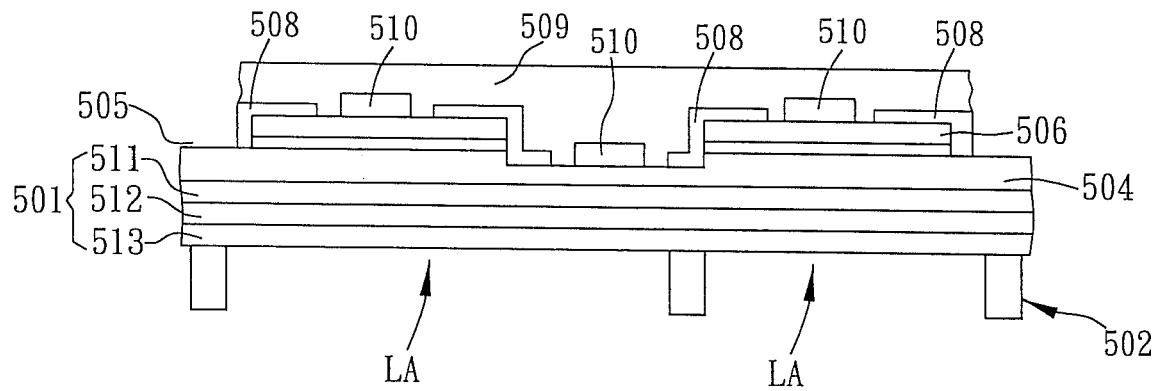
Figure 12I:
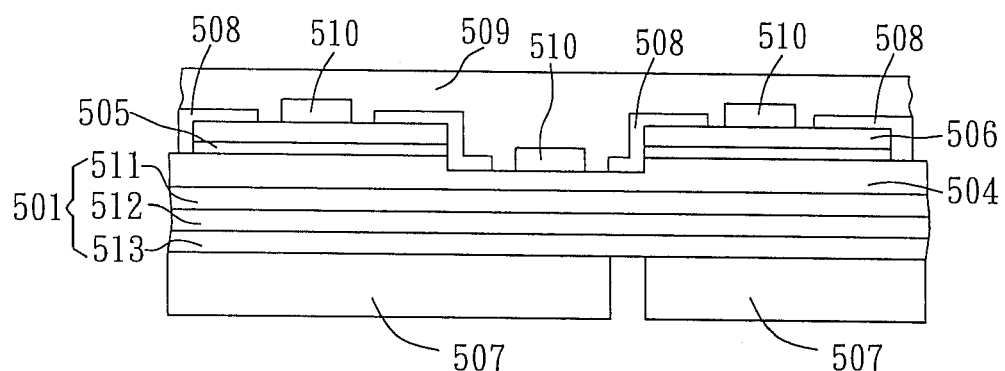

As shown in FIG. 12H, a patterned photoresist layer 502 is formed on the metal combining layer 513 of the seed layer 501 in step S509. The patterned photoresist layer 502 has a plurality of limiting areas LA. Then, as shown in FIG. 12I, at least one thermal-conductive substrate 507 is formed on the LED device 50 in step S510. Herein, the thermal-conductive substrate 507 is formed on the seed layer 501, and the location thereof is defined by the limiting areas LA of the patterned photoresist layer 502. The material and forming method of the thermal-conductive substrate 507 are the same as those of the thermal-conductive substrate 107 of the first embodiment, so the detailed descriptions are omitted.

Figure 12J:
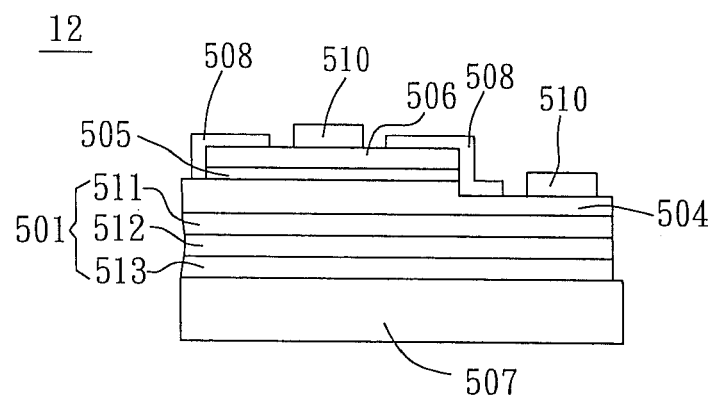

As shown in FIG. 12J, in step S511, the temporary substrate 509 is removed so as to form a plurality of vertical LED apparatuses 12. Since the curable material has the properties of removable, expansible and extensible, the temporary substrate 509 can be removed easily by heating, water heating, UV light, chemical solution or organic solution. While the temporary substrate 509 is removed, the first semiconductor layer 504, the seed layer 501 and the insulating thermal-conductive layer 512 disposed between two LED apparatuses are simultaneously removed. Accordingly, the LED devices are separated to form a plurality of LED apparatuses 12.

It is to be specified that the above-mentioned steps are unnecessary to be performed in the order of the embodiment, and they can be switched depending on the actual needs of processing.

Sixth Embodiment

Figure 13:
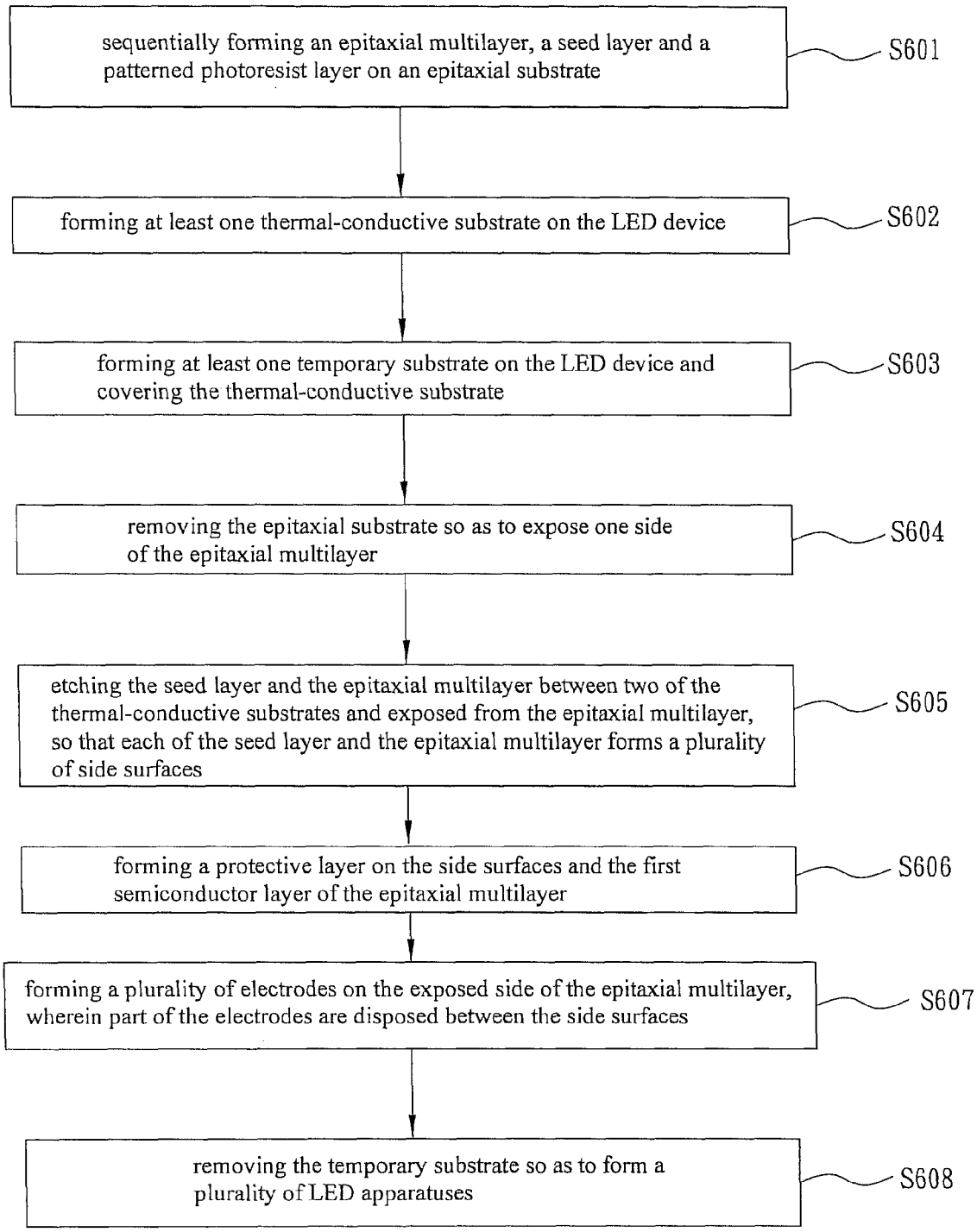
FIG. 13 is a flow chart of a manufacturing method of a plurality of LED apparatuses according to a sixth embodiment of the invention.

With reference to FIG. 13, a manufacturing method of a plurality of LED apparatuses 14 according to a sixth embodiment of the invention includes the following steps S601 to S608. The detailed illustrations of the manufacturing method will be described herein below with reference to FIGS. 14A to 14G.

Figure 14A:
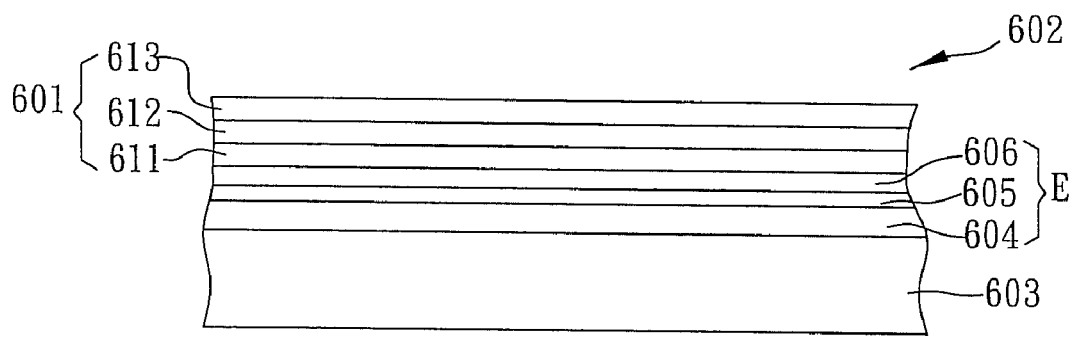
FIGS. 14A to 14G are schematic illustrations showing the LED apparatuses manufactured by the manufacturing method according to the sixth embodiment of the invention.

As shown in FIG. 14A, in step S601, an epitaxial multilayer E, a seed layer 601 and a patterned photoresist layer 602 are in sequence formed on an epitaxial substrate 603, thereby forming a LED device 60. The epitaxial multilayer E includes a first semiconductor layer 604, a light emitting layer 605 and a second semiconductor layer 606. The first semiconductor layer 604 is formed on the epitaxial substrate 603, the light emitting layer 605 is formed on the first semiconductor layer 604, and then the second semiconductor layer 606 is formed on the light emitting layer 605. The seed layer 601 is formed on the second semiconductor layer 606, and further includes an insulating thermal-conductive layer 612 and a metal combining layer 613. To be noted, the seed layer 601 includes a reflective layer, an ohmic contact layer and/or a transparent conductive layer as the seed layer 101 of the first embodiment, and further includes the insulating thermal-conductive layer 612 and the metal combining layer 613. In other words, the seed layer 601 is preferably composed of a reflective layer, an ohmic contact layer, an insulating thermal-conductive layer and a metal combining layer. Alternatively, the seed layer 601 can be composed of an ohmic contact layer with the reflective function 611, an insulating thermal-conductive layer 612 and a metal combining layer 613. The insulating thermal-conductive layer 612, which is made of, for example, aluminum nitride or silicon carbide, can help the LED apparatus to achieve better anti-static. A material of the metal combining layer 613 includes nickel (Ni), copper (Cu), cobalt (Co), gold (Au), aluminum (Al) or a combination thereof.

The patterned photoresist layer 602 is formed on the seed layer 601 and has a plurality of limiting areas LA. The material of the seed layer 601 is the same as that of the seed layer 601 of the first embodiment, so the detailed descriptions are omitted.

Figure 14B:
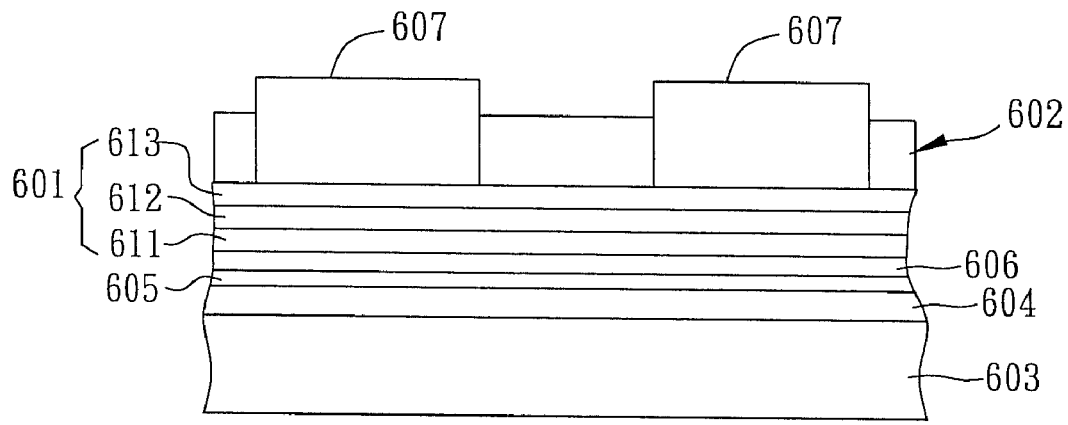

As shown in FIG. 14B, at least one thermal-conductive substrate 607 is formed on the LED device 60 in step S602. Herein, the thermal-conductive substrate 607 is formed on the seed layer 601 by electrochemical deposition, non-electroplating, electroforming or electroplating. The position of the thermal-conductive substrate 607 is defined by the limiting areas LA of the patterned photoresist layer 602. A material of the thermal-conductive substrate 607 includes a thermal-conductive metal, such as nickel (Ni), copper (Cu), cobalt (Co), gold (Au) or aluminum (Al). To be noted, the thermal-conductive substrate 607 can be composed of a single material or be composed of multiple thermal-conductive metals and include a plurality of layers, such as three layers of Cu—Ni—Cu or Ni—Cu—Ni. The above examples are for illustrations only without limiting the scope of the invention, and any design capable of achieving good thermal conducting effect can be applied in this embodiment.

Figure 14C:
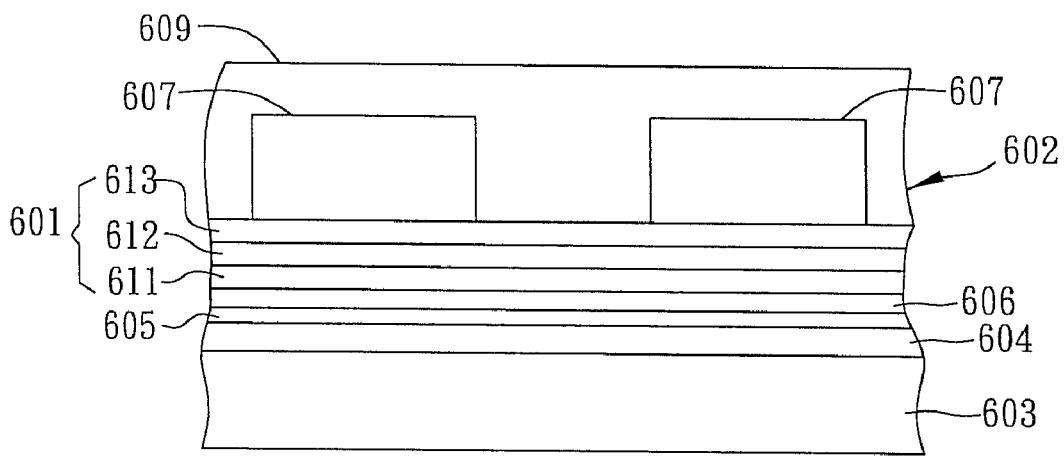

As shown in FIG. 14C, at least one temporary substrate 609 is formed on the LED device 60 in step S603. In the embodiment, the temporary substrate 609 covers the thermal-conductive substrate 607. Alternatively, a temporary substrate is provided, and a curable material is formed between the temporary substrate and the LED device as an adhesive layer, and then the curable material is cured. The material and forming method of the temporary substrate 609 are the same as those of the temporary substrate 109 of the first embodiment, so the detailed descriptions are omitted.

Figure 14D:
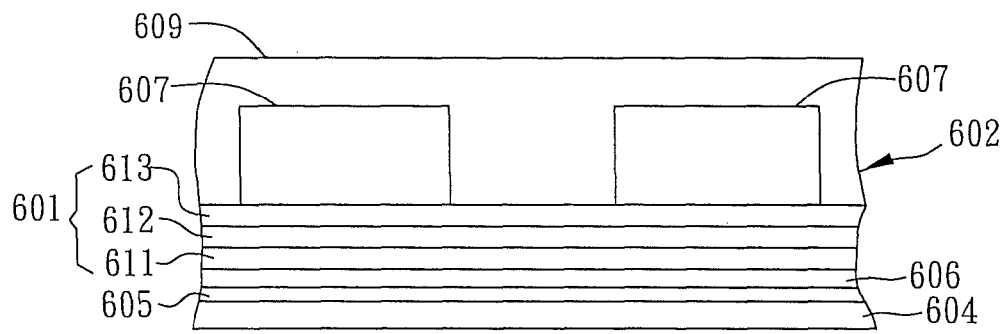

After forming the temporary substrate 609, as shown in FIG. 14D, the epitaxial substrate 603 is removed in step S604 so as to expose one side of the epitaxial multilayer E. In the embodiment, the first semiconductor layer 604 of the epitaxial multilayer E is exposed. Herein, the epitaxial substrate 603 can be removed by laser lift-off, laser ablation, polishing or etching.

Figure 14E:
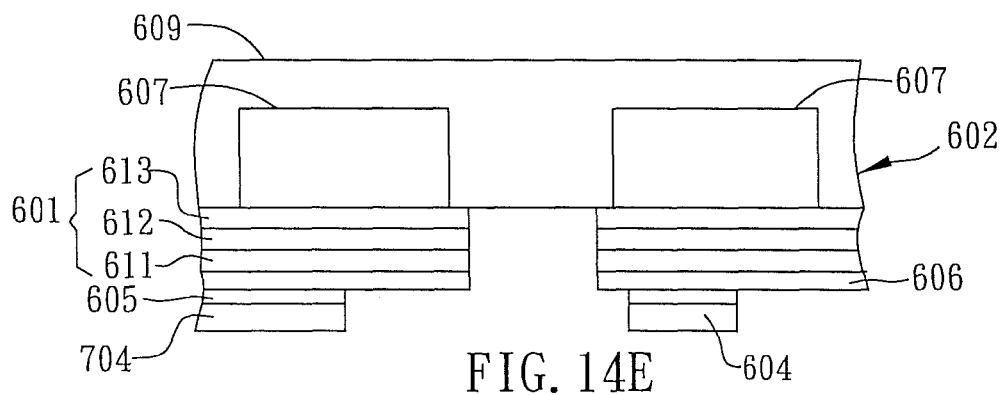

As shown in FIG. 14E, in step S605, the seed layer 601 and the epitaxial multilayer E between two of the thermal-conductive substrates 607 and exposed from the epitaxial multilayer E are etched away, so that each of the seed layer 601 and the epitaxial multilayer E forms a plurality of side surfaces, and a portion of the second semiconductor layer 606 is exposed. Herein, the etching step can be performed by a dry etching process or a wet etching process.

Figure 14F:
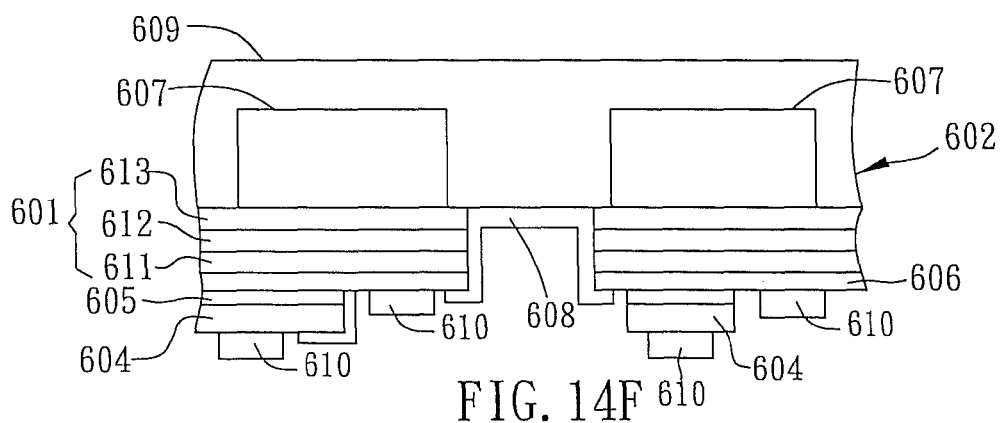

As shown in FIG. 14F, a protective layer 608 is formed on the side surfaces and the epitaxial multilayer E in step S606. In this step S606, the protective layer 608 has an opening for forming electrodes in the later step. The material of the protective layer 608 is an insulating dielectric material such as oxide, nitride or silicon carbide. In step S607, a plurality of electrodes 610 are formed on the exposed side of the epitaxial multilayer E, and the exposed portion of the second semiconductor layer. The electrodes 610 are located in the opening of the protective layer 608, and a part of the electrodes 610 are disposed between the side surfaces.

Figure 14G:
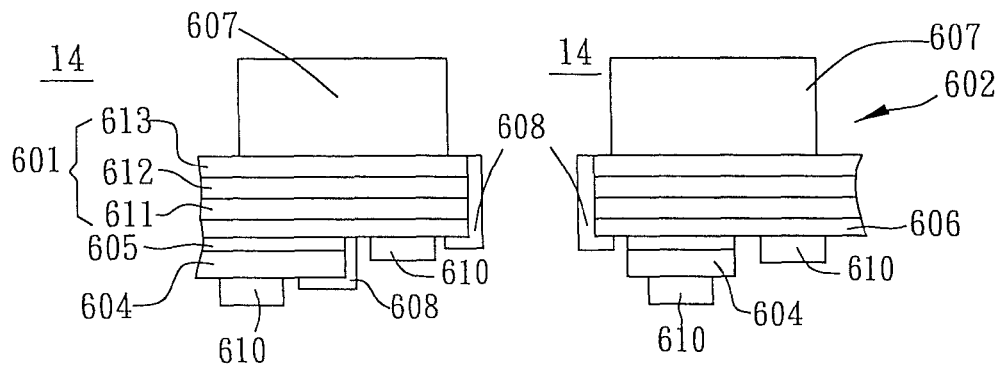

As shown in FIG. 14G, in step S608, the temporary substrate 609 is removed after forming the electrodes 610, so that a plurality of LED apparatuses 14 can be formed. Since the curable material has the properties of removable, expansible and extensible, the temporary substrate 609 can be removed easily by heating, water heating, UV light, chemical solution or organic solution.

It is to be specified that the above-mentioned steps are unnecessary to be performed in the order of the embodiment, and they can be switched depending on the actual needs of processing.

Seventh Embodiment

Figure 15:
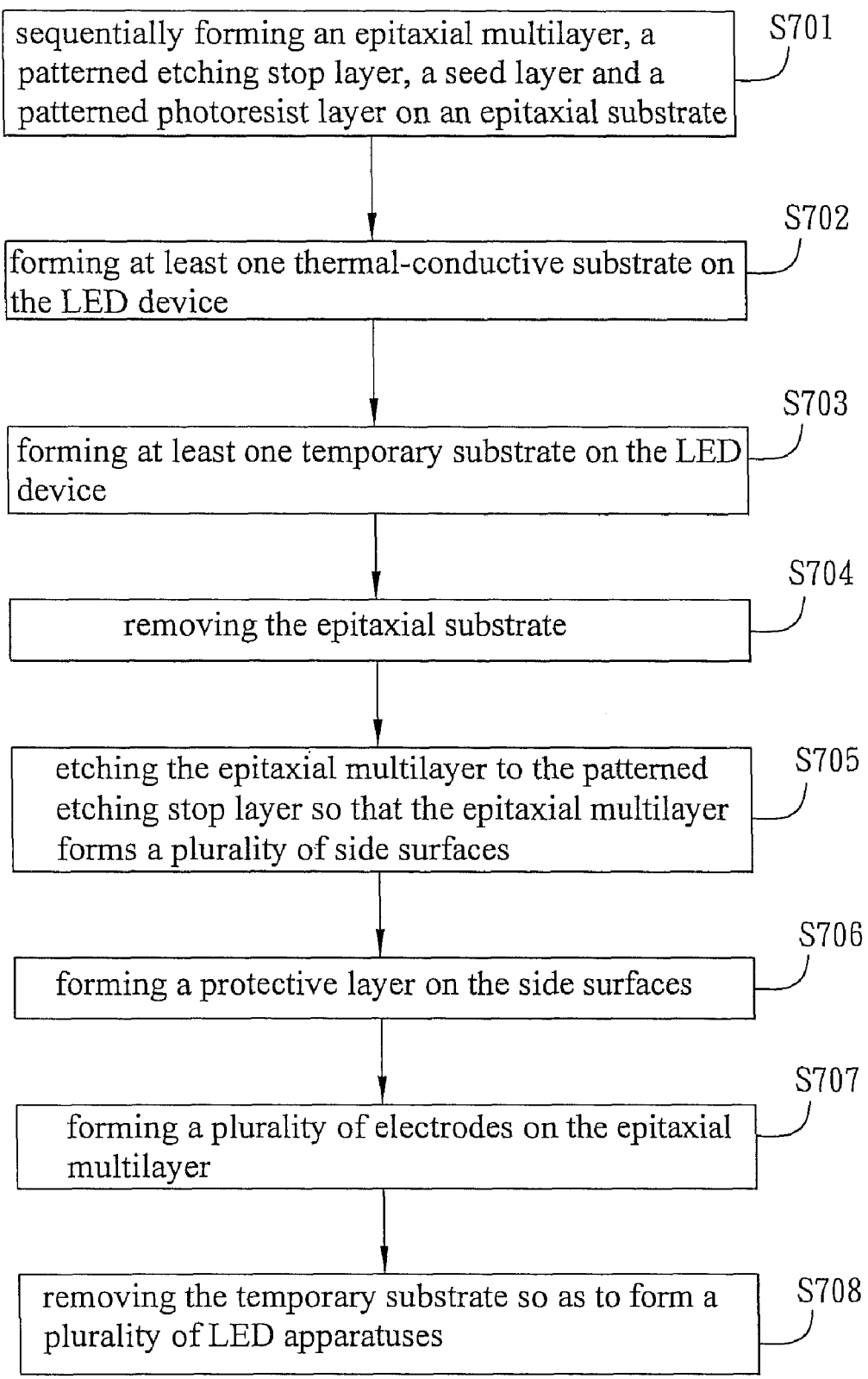
FIG. 15 is a flow chart of a manufacturing method of a plurality of LED apparatuses according to a seventh embodiment of the invention.

With reference to FIG. 15, a manufacturing method of a plurality of LED apparatuses 16 according to a seventh embodiment of the invention includes the following steps S701 to S708. The detailed illustrations of the manufacturing method will be described herein below with reference to FIGS. 16A to 16I.

Figure 16A:
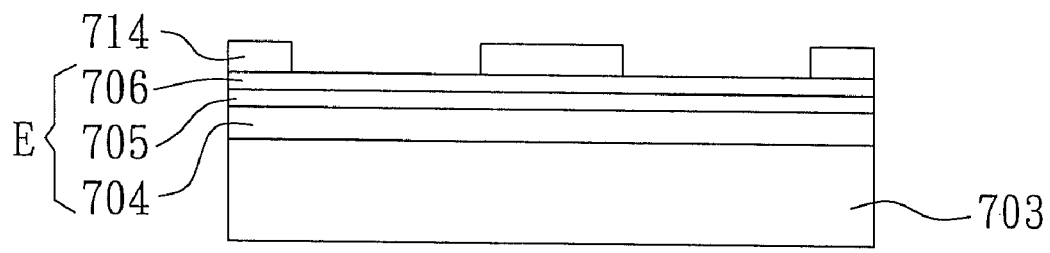
FIGS. 16A to 16I are schematic illustrations showing the LED apparatuses manufactured by the manufacturing method according to the seventh embodiment of the invention.
Figure 16B:
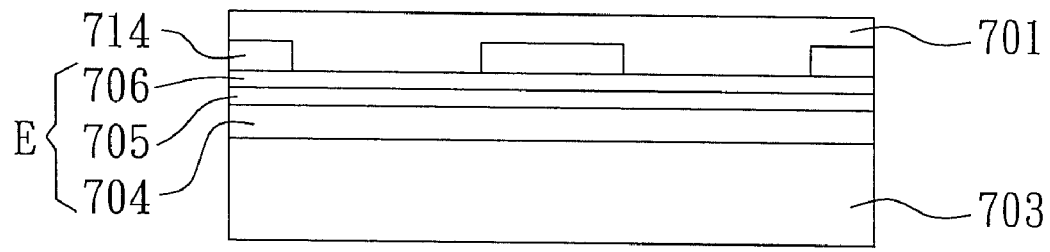
Figure 16C:
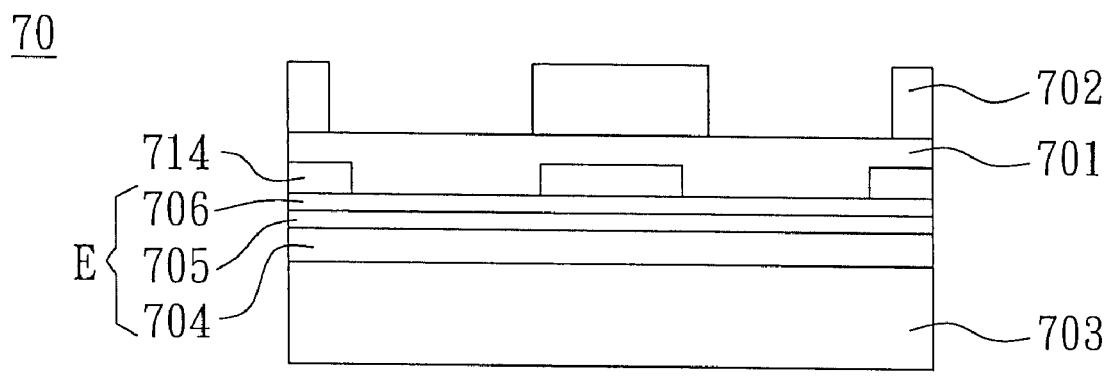

As shown in FIGS. 16A to 16C, in step S701, an epitaxial multilayer E, an patterned etching stop layer 714, a seed layer 701 and a patterned photoresist layer 702 are in sequence formed on an epitaxial substrate 703, thereby forming a LED device 70. The epitaxial multilayer E, the seed layer 701 and the patterned photoresist layer 702 are illustrated in the above-mentioned embodiments, so the detailed descriptions are omitted. The patterned photoresist layer 702 has a plurality of limiting areas LA. A material of the patterned etching stop layer 714 includes oxide, nitride or silicon carbide.

Figure 16D:
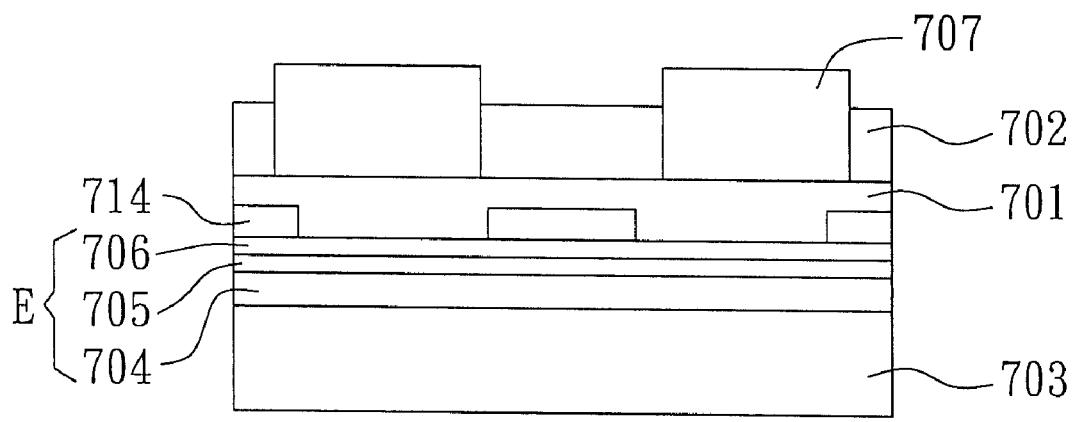

As shown in FIG. 16D, in step S702, at least one thermal-conductive substrate 707 is formed on the LED device 70 of FIG. 16C. The thermal-conductive substrate 707 is illustrated in the above-mentioned embodiments, so the detailed descriptions are omitted.

Figure 16E:
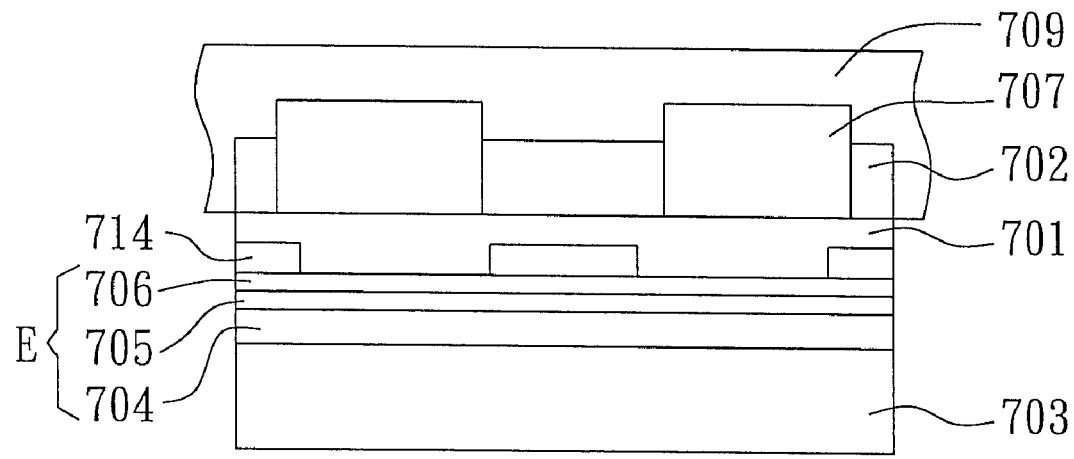

As shown in FIG. 16E, in step S703, at least one temporary substrate 709 is formed on the LED device 70. In the embodiment, the temporary substrate 709 covers the thermal-conductive substrate 707. Alternatively, a temporary substrate is provided, and a curable material is formed between the temporary substrate and the LED device as an adhesive layer, and then the curable material is cured. The temporary substrate 709 is illustrated in the above-mentioned embodiments, so the detailed descriptions are omitted.

Figure 16F:
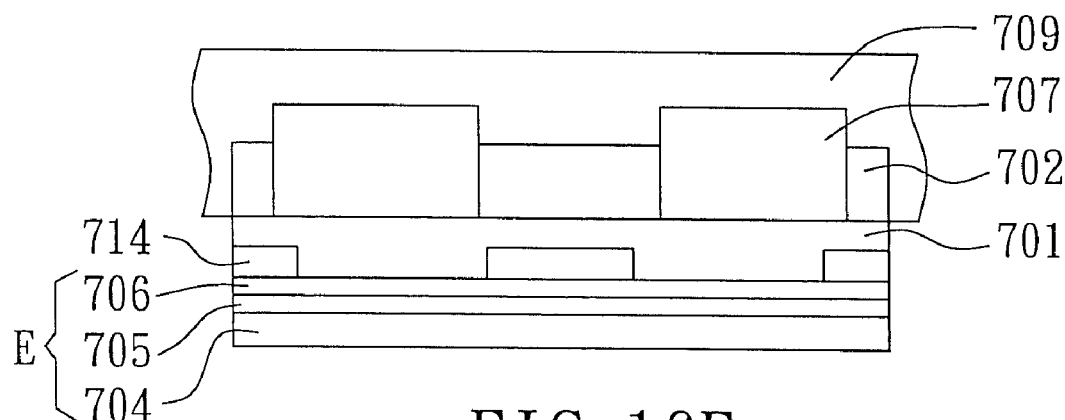
Figure 16G:
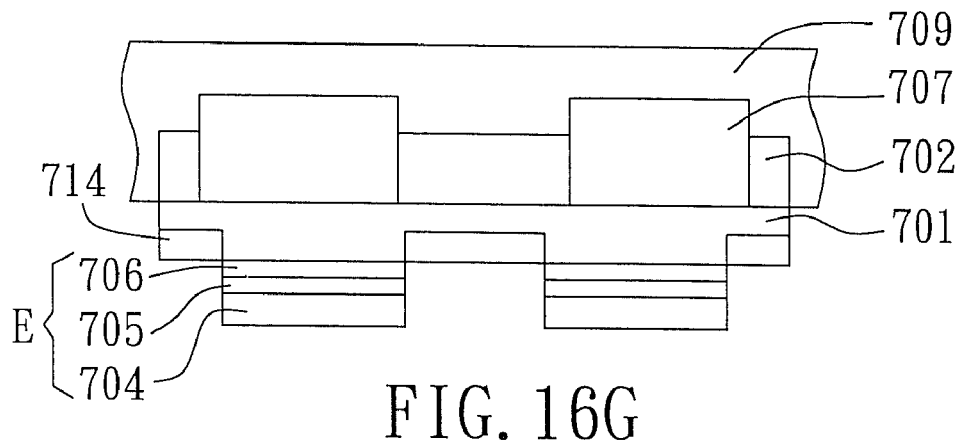

As shown in FIG. 16F, the epitaxial substrate 703 is removed in step S704. The method for removing the epitaxial substrate 703 is illustrated hereinabove, so the detailed descriptions are omitted. Then, as shown in FIG. 16G, the epitaxial multilayer E is etched to the patterned etching stop layer 714 in step S705 so that the epitaxial multilayer E forms a plurality of side surfaces. The patterned etching stop layer 714 can provide the stopping and buffering effects when performing the step of etching the epitaxial multilayer E. Thus, the seed layer 701 containing metal materials is prevented from being etched, so that the conventional current leakage caused by the metal particles from the etched seed layer attaching to the side surfaces of the epitaxial multilayer can be avoided.

Figure 16H:
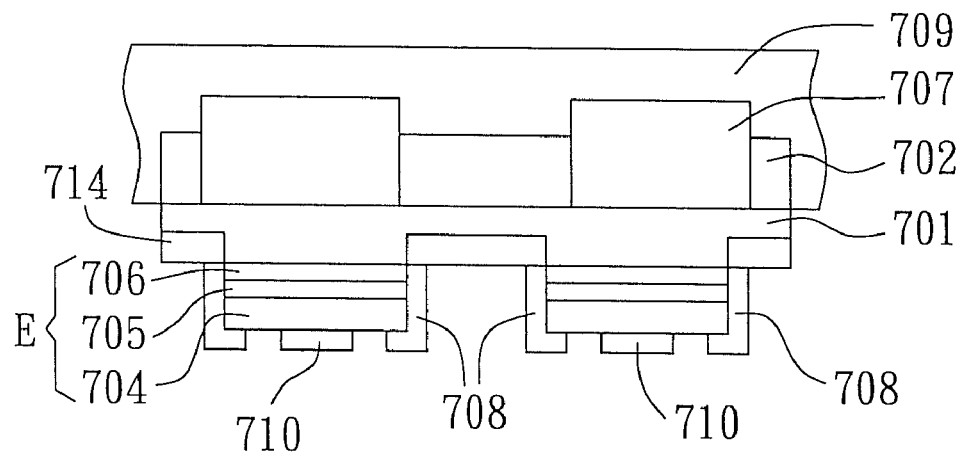

As shown in FIG. 16H, a protective layer 708 is formed on the side surfaces in step S706. In step S707, a plurality of electrodes 710 are formed on the epitaxial multilayer E. The functions of the protective layer 708 and the electrodes 710 are illustrated in the above-mentioned embodiments, so the detailed descriptions are omitted.

Figure 16I:
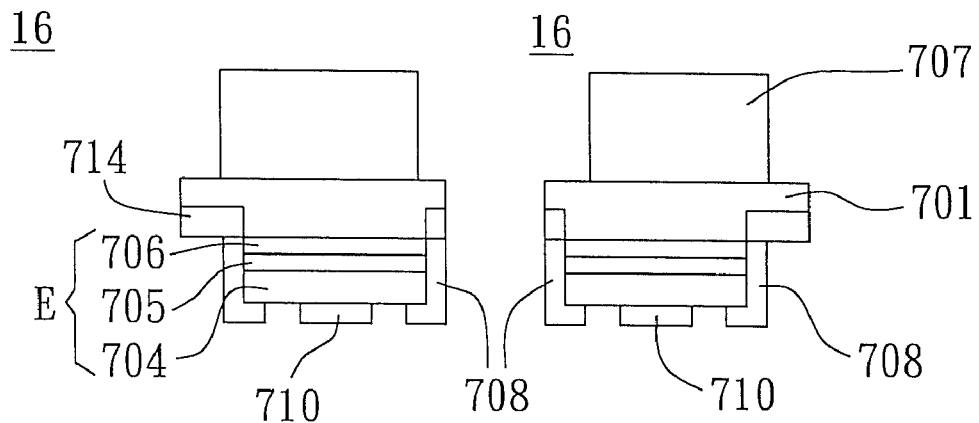

As shown in FIG. 16I, in step S708, the temporary substrate 709 is removed so as to form a plurality of vertical LED apparatuses 16. The function and advantage of the temporary substrate 709 are illustrated in the above-mentioned embodiments, so the detailed descriptions are omitted.

It is to be specified that the above-mentioned steps are unnecessary to be performed in the order of the embodiment, and they can be switched depending on the actual needs of processing.

Eighth Embodiment

Figure 17:
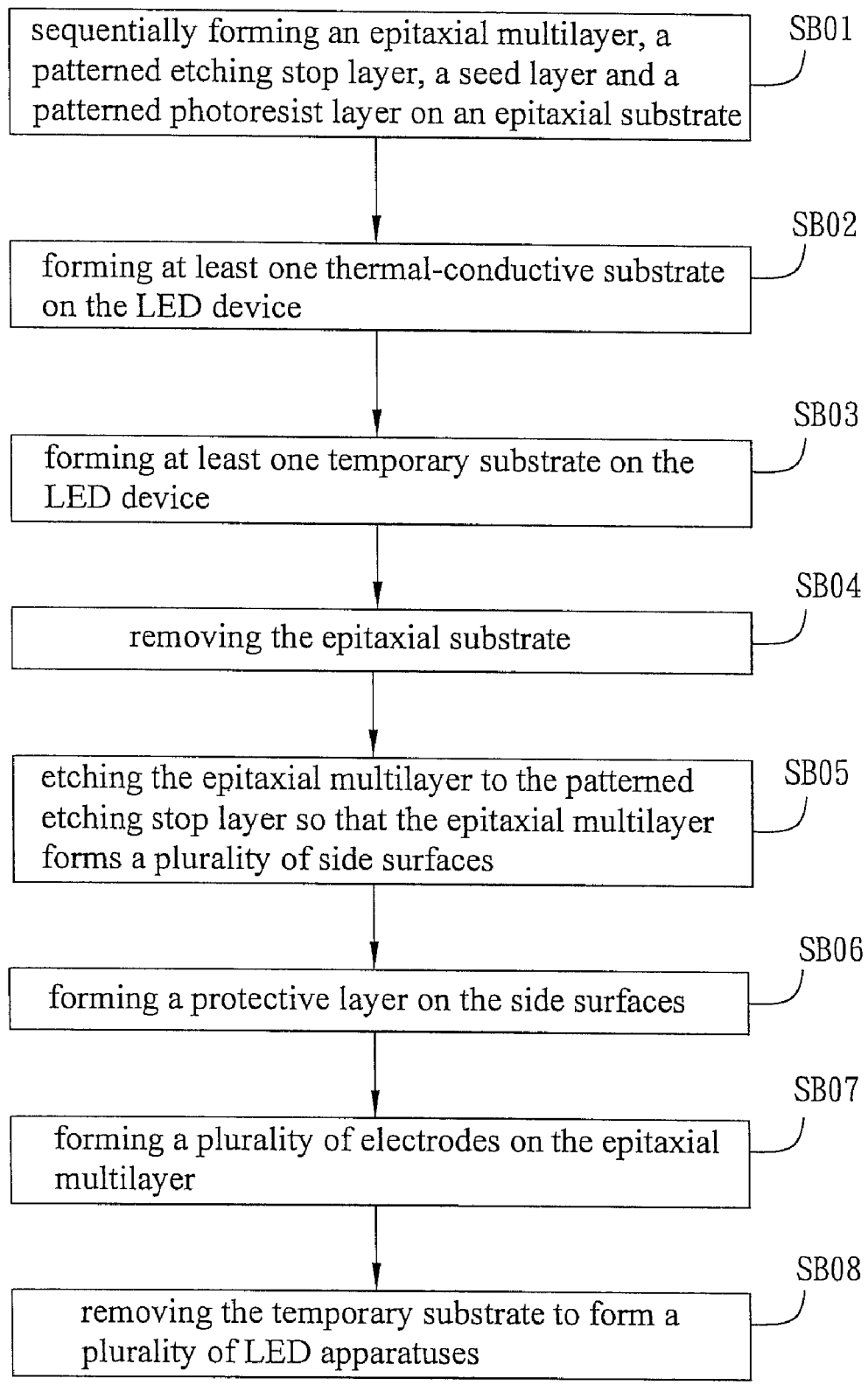
FIG. 17 is a flow chart of a manufacturing method of a plurality of LED apparatuses according to an eighth embodiment of the invention.

With reference to FIG. 17, a manufacturing method of a plurality of LED apparatuses 18 according to an eighth embodiment of the invention includes the following steps SB01 to SB08. The detailed illustrations of the manufacturing method will be described herein below with reference to FIGS. 18A to 18I.

Figure 18A:
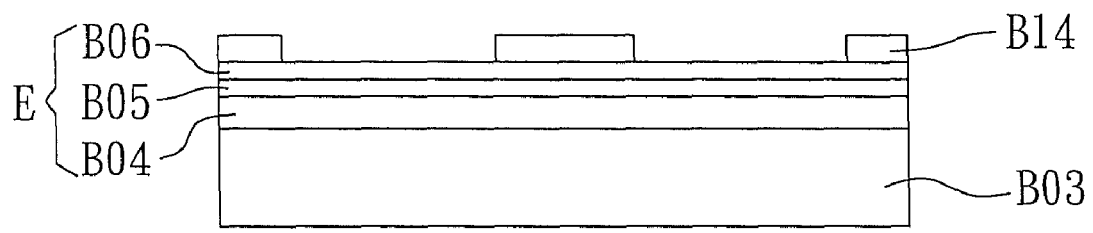
FIGS. 18A to 18I are schematic illustrations showing the LED apparatuses manufactured by the manufacturing method according to the eighth embodiment of the invention.
Figure 18B:
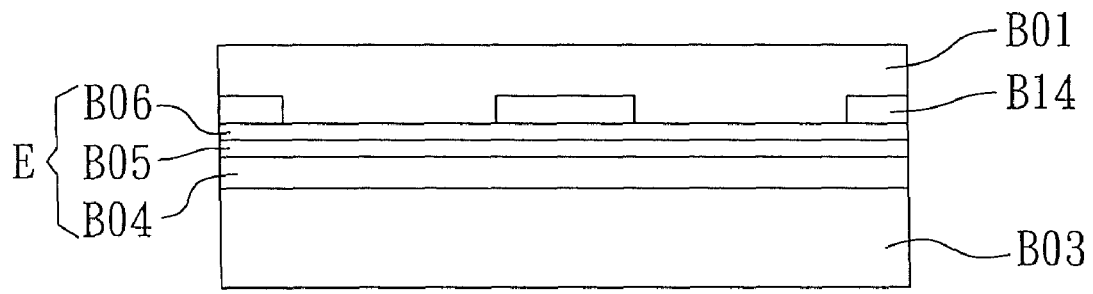
Figure 18C:
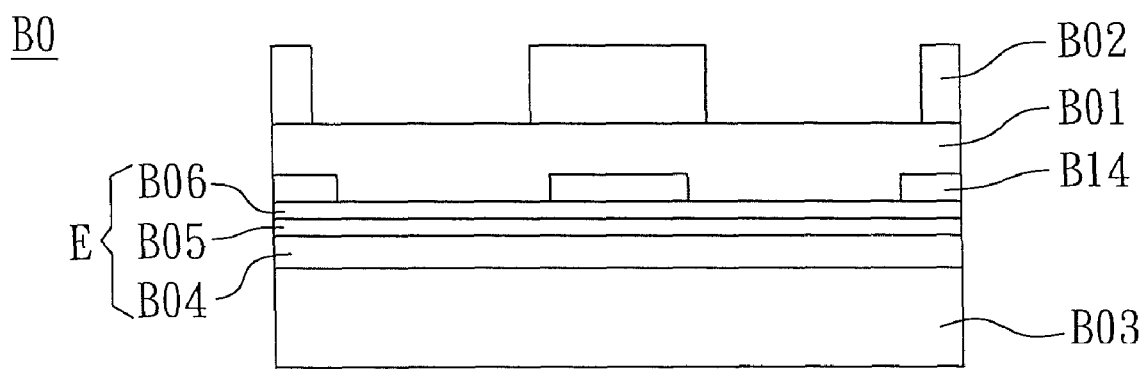
Figure 18D:
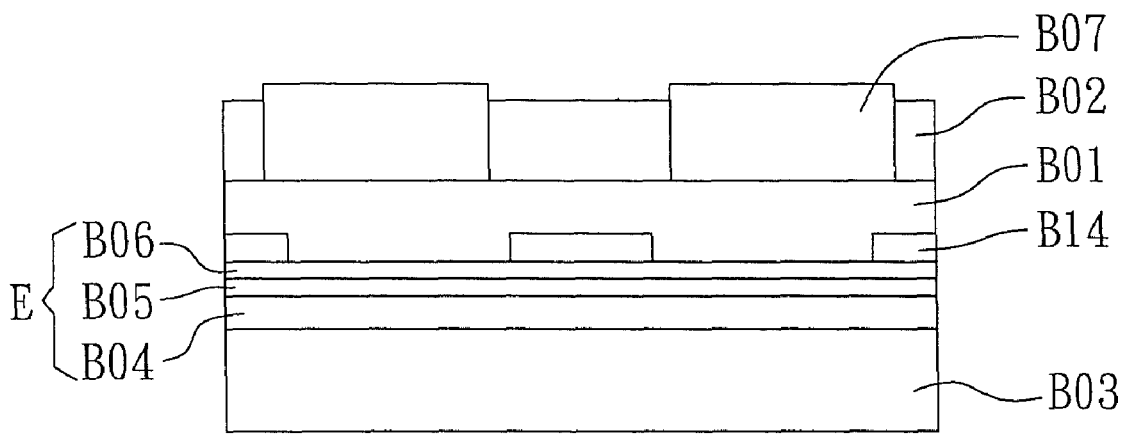
Figure 18E:
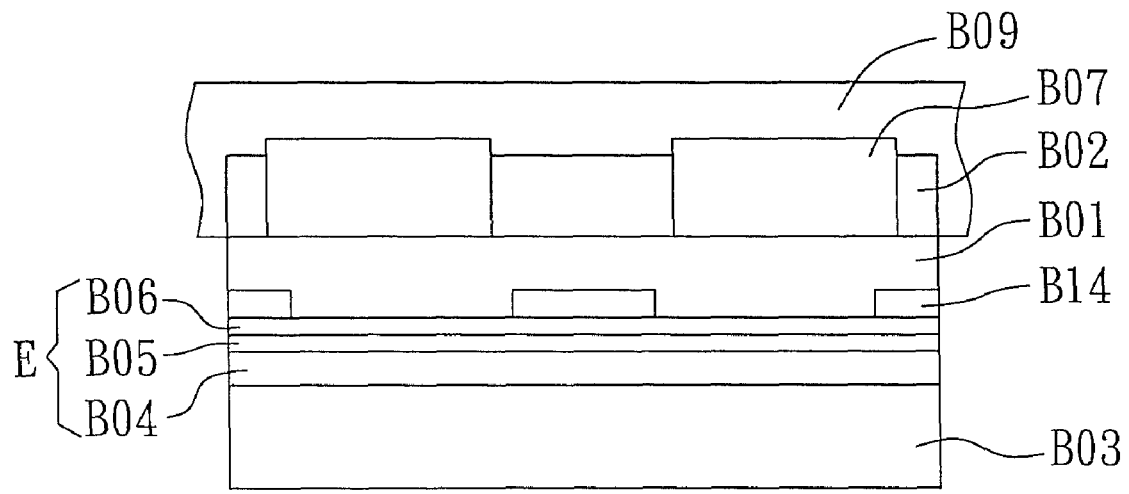

As shown in FIGS. 18A to 18C, in step SB01, an epitaxial multilayer E, an patterned etching stop layer B14, a seed layer B01 and a patterned photoresist layer B02 are in sequence formed on an epitaxial substrate B03, thereby forming a LED device B0. As shown in FIG. 18D, in step SB02, at least one thermal-conductive substrate B07 is formed on the LED device B0 of FIG. 18C. As shown in FIG. 18E, in step SB03, at least one temporary substrate B09 is formed on the LED device B0. In the embodiment, the temporary substrate B09 covers the thermal-conductive substrate B07. Alternatively, a temporary substrate is provided, and a curable material is formed between the temporary substrate and the LED device as an adhesive layer, and then the curable material is cured.

Figure 18F:
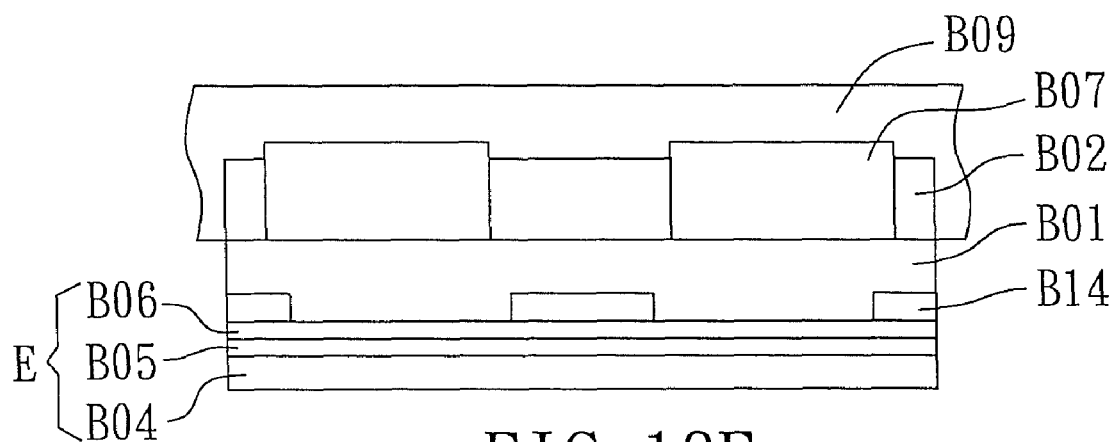
Figure 18G:
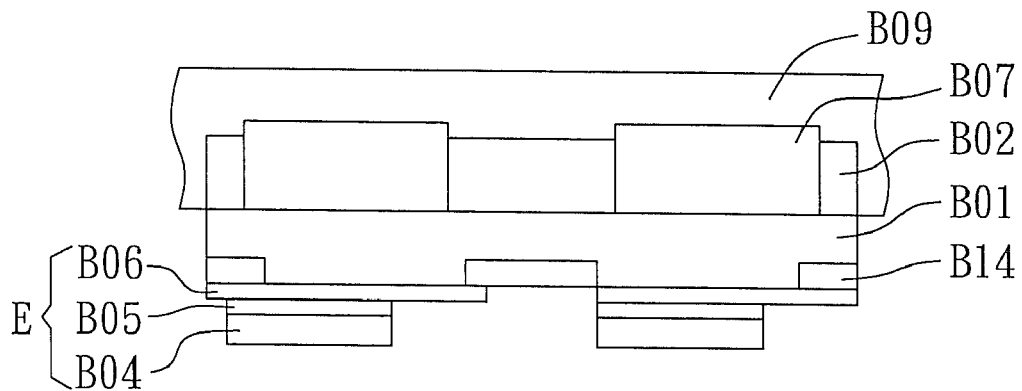
Figure 18H:
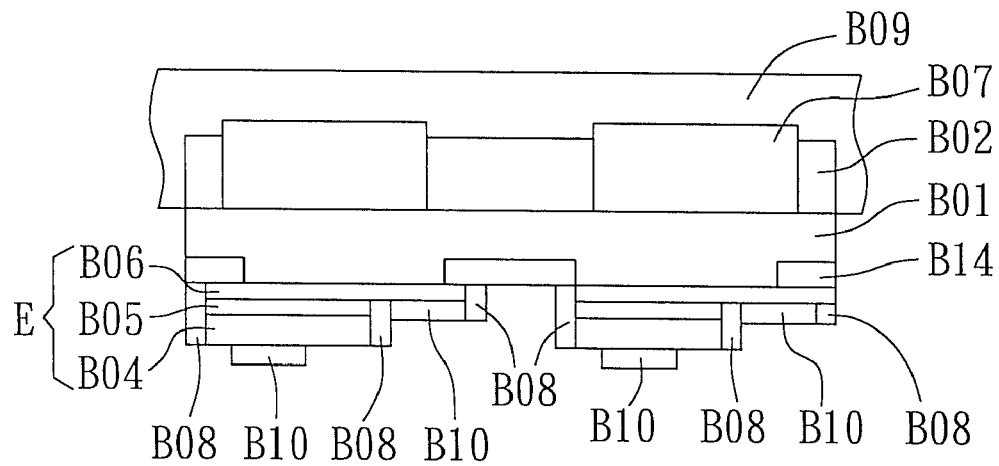
Figure 18I:
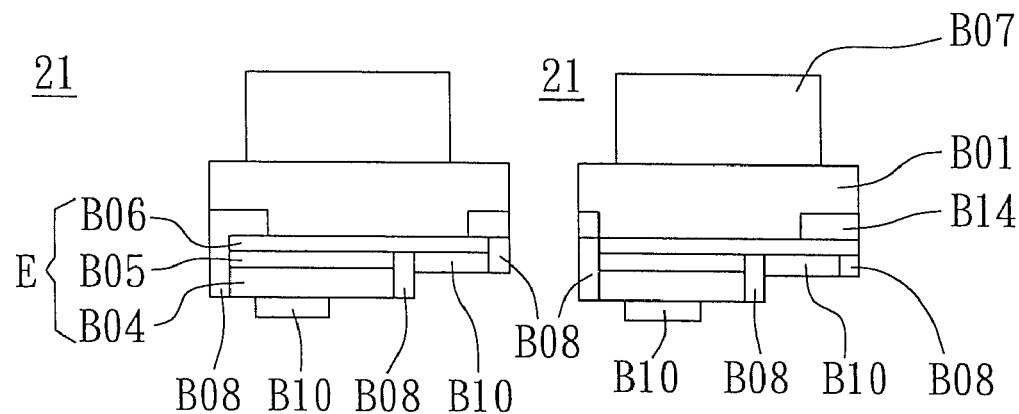

As shown in FIG. 18F, the epitaxial substrate B03 is removed in step SB04. Then, as shown in FIG. 18G, the epitaxial multilayer E is etched to the patterned etching stop layer B14 in step SB05 so that the epitaxial multilayer E forms a plurality of side surfaces, and a portion of the second semiconductor layer B06 is exposed. As shown in FIG. 18H, a protective layer B08 is formed on the side surfaces in step SB06. In step SB07, a plurality of electrodes B11 are formed on the epitaxial multilayer E, and part of the electrodes B 10 is disposed between the protective layers B08 on the exposed portion of the second semiconductor layer B06. As shown in FIG. 18I, the temporary substrate B09 is removed to form a plurality of LED apparatuses 21. The function and advantage of the temporary substrate B09 are illustrated in the above-mentioned embodiments, so the detailed descriptions are omitted.

It is to be specified that the above-mentioned steps are unnecessary to be performed in the order of the embodiment, and they can be switched depending on the actual needs of processing.

In summary, the manufacturing method of a LED apparatus according to the invention is to form a temporary substrate on the LED device directly by the curable material and to form at least one thermal-conductive substrate on the LED device. Compared with the prior art, the invention does not need the conventional step of adhering the semiconductor structure to another substrate with an adhering layer. In addition, since the temporary substrate is made of the curable material, which has the properties of removable, expansible and extendible, it can be easily removed so as to separate the LED devices, thereby forming a plurality of LED apparatuses. Therefore, the current leakage caused by the dicing process can be prevented, thereby decreasing the production cost and increasing the production yield.

In addition, the thermal-conductive substrate of the invention is formed by electrochemical deposition, non-electroplating, electroforming or electroplating, so that the invention does not need the conventional transparent adhering layer, which causes poor heat dissipation. In addition, the invention also does not need the high-temperature high-pressure process, which causes diffusion. Accordingly, the heat dissipation effect and production yield of the invention can be enhanced. Moreover, the invention further arranges the protective layer for preventing the current leakage.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A manufacturing method of a plurality of light-emitting diode (LED) apparatuses, the method comprising steps of:
   providing a LED device, wherein the LED device comprises an epitaxial substrate and an epitaxial multilayer formed on the epitaxial substrate, and the epitaxial multilayer comprises a first semiconductor layer, a light emitting layer and a second semiconductor layer formed on the epitaxial substrate in sequence;
   forming a seed layer on the epitaxial multilayer;
   forming a patterned photoresist layer on the seed layer, wherein the patterned photoresist layer comprises a plurality of limiting areas for defining positions of a plurality of thermal-conductive substrates;
   forming the thermal-conductive substrates on the LED device; and
   forming at least one temporary substrate on a side of the LED device.

2. The manufacturing method according to claim 1, wherein the thermal-conductive substrate is formed by electrochemical deposition, non-electroplating, electroforming or electroplating, and a material of the thermal-conductive substrate comprises nickel (Ni), copper (Cu), cobalt (Co), gold (Au), aluminum (Al) or a thermal-conductive metal.

3. The manufacturing method according to claim 1, wherein the step of forming the temporary substrate comprises steps of:

providing the temporary substrate;
forming a curable material between the temporary substrate and the thermal-conductive substrates; and
curing the curable material.

4. The manufacturing method according to claim 1, further comprising removing the temporary substrate to form the plurality of LED apparatuses by beating, water heating, UV light, chemical solution or organic solution.

5. The manufacturing method according to claim 1, wherein one of the first and the second semiconductor layers is an N-type epitaxial layer and the other is a P-type epitaxial layer.

6. The manufacturing method according to claim 1, wherein the seed layer comprises a reflective layer, an ohmic contact layer and/or a transparent conductive layer; and a material of the reflective layer comprises titanium (Ti), aluminum (Al), chromium (Cr), nickel (Ni), platinum (Pt), gold (Au), silver (Ag), chromium/gold (Cr/Au), nickel/gold (Ni/Au), palladium (Pd), titanium/gold (Ti/Au), titanium/silver (Ti/Ag), chromium/platinum/gold (Cr/Pt/Au), metal, a dielectric material, an alloy thereof, a multi-metal layer thereof or a combination thereof; and a material of the ohmic contact layer comprises nickel/gold (Ni/Au), indium tin oxide (ITO), titanium nitride (TiN), Cadimium tin oxide (CTO), nickel oxide (NiO), indium zinc oxide (IZO) or aluminum doped zinc oxide (AZO).

7. The manufacturing method according to claim 1, further comprising steps of:
removing the epitaxial substrate to expose a side of the epitaxial multilayer;
etching the epitaxial multilayer and the seed layer and exposing a portion of the second semiconductor layer;
forming a protective layer abutted on the epitaxial multilayer;
forming a plurality of electrodes on the exposed side of the epitaxial multilayer, wherein a part of the electrodes are disposed on the exposed second semiconductor layer; and
removing the temporary substrate to form the plurality of LED apparatuses.

8. The manufacturing method according to claim 1, wherein the step of forming the temporary substrate comprises steps of:
forming a curable material; and
curing the curable material.

9. The manufacturing method according to claim 8, wherein a material of the temporary substrate comprises photoresist, fluoro carbon rubber, fluoroelastomer, UV gel, instant adhesive or a curable material; the curable material is formed by spin coating, screen printing, mesh printing or glue dispensing; and the curable material is cured by photo curing, thermal curing or cool curing.

10. The manufacturing method according to claim 1, wherein after forming the patterned photoresist layer and thermal conductive substrate, the method further comprises steps of:
etching the seed layer and the epitaxial multilayer to expose a portion of the epitaxial substrate so that each of the seed layer and the epitaxial multilayer forms a plurality of side surfaces;
forming a protective layer abutted on the epitaxial multilayer;
removing the epitaxial substrate to expose a side of the epitaxial multilayer;
forming a plurality of electrodes on the exposed side of the epitaxial multilayer opposite to the temporary substrate; and
removing the temporary substrate to form the plurality of LED apparatuses.

11. The manufacturing method according to claim 10, wherein a material of the protective layer comprises an oxide, a nitride, a silicon carbide or an insulating dielectric material; and the epitaxial substrate is removed by laser lift-off, laser ablation, polishing or etching.

12. The manufacturing method according to claim 1, wherein after the step of forming the patterned photoresist layer and thermal conductive substrate, the manufacturing method further comprises steps of:
removing the epitaxial substrate to expose a side of the epitaxial multilayer;
forming a plurality of electrodes on the exposed side of the epitaxial multilayer opposite to the temporary substrate;
etching the epitaxial multilayer and the seed layer between two of the thermal-conductive substrates so that each of the epitaxial multilayer and the seed layer has a plurality of side surfaces,
forming a protective layer abutted on the epitaxial multilayer; and
removing the temporary substrate to form the plurality of LED apparatuses.

13. The manufacturing method according to claim 12, wherein a material of the protective layer comprises an oxide, a nitride, a silicon carbide or an insulating dielectric material, and the epitaxial substrate is removed by laser lift-off, laser ablation, polishing or etching.

14. A manufacturing method of a plurality of light-emitting diode (LED) apparatuses, comprising:
providing an epitaxial substrate;
forming an epitaxial multilayer, and a patterned photoresist layer on the epitaxial substrate;
forming a plurality of thermal-conductive substrates on the epitaxial multilayer;
etching the epitaxial multilayer to expose a portion of the epitaxial substrate,
forming a protective layer abutted on the epitaxial multilayer; and
forming at least one temporary substrate over the thermal-conductive substrate and the protective layer.

15. The manufacturing method according to claim 14, further comprising steps of:
removing the epitaxial substrate to expose a side of the epitaxial multilayer;
forming a plurality of electrodes at the exposed side of the epitaxial multilayer opposite to the temporary substrate; and
removing the temporary substrate to form the plurality of LED apparatuses.

16. A manufacturing method of a plurality of light-emitting diode (LED) apparatuses, the method comprising steps of:
providing a LED device, wherein the LED device comprises an epitaxial substrate and an epitaxial multilayer formed on the epitaxial substrate, and the epitaxial multilayer comprises a first semiconductor layer, a light emitting layer and a second semiconductor layer formed on the epitaxial substrate in sequence;
etching the epitaxial multilayer to expose a portion of the epitaxial substrate so that each of the epitaxial multilayer forms a plurality of side surfaces; and
forming a protective layer abutted on the epitaxial multilayer;

forming a seed layer over the epitaxial multilayer and the protective layer;

forming a patterned photoresist layer on the seed layer, wherein the patterned photoresist layer comprises a plurality of limiting areas for defining positions of a plurality of thermal-conductive substrates;

forming the thermal-conductive substrates on the LED device; and forming at least one temporary substrate on a side of the LED device.

17. The manufacturing method according to claim 16, the manufacturing method further comprising steps of:

removing the epitaxial substrate to expose a side of the epitaxial multilayer;

forming a plurality of electrodes at the exposed side of the epitaxial multilayer opposite to the temporary substrate; and removing the temporary substrate to form the plurality of LED apparatuses.

18. The manufacturing method according to claim 17, wherein the seed layer comprises a reflective layer, an ohmic contact layer and/or a transparent conductive layer; a material of the reflective layer comprises titanium (Ti), aluminum (Al), chromium (Cr), nickel (Ni), platinum (Pt), gold (Au), silver (Ag), chromium/gold (Cr/Au), nickel/gold (Ni/Au), palladium (Pd), titanium/gold (Ti/Au), titanium/silver (Ti/Ag), chromium/platinum/gold (Cr/Pt/Au), metal, a dielectric material, an alloy thereof, a multi-metal layer thereof or a combination thereof; a material of the ohmic contact layer comprises nickel/gold (Ni/Au), indium tin oxide (ITO), titanium nitride (TiN), cadimium tin oxide (CTO), nickel oxide (NiO, indium zinc oxide (IZO) or aluminum doped zinc oxide (AZO); a material of the protective layer comprises an oxide, a nitride, a silicon carbide or an insulating dielectric material; and the epitaxial substrate is removed by laser lift-off, laser ablation, polishing or etching.

19. A manufacturing method of a plurality of light-emitting diode (LED) apparatuses, the method comprising steps of:

providing a LED device, wherein the LED device comprises an epitaxial substrate and an epitaxial multilayer formed on the epitaxial substrate, and the epitaxial multilayer comprises a first semiconductor layer, a light emitting layer and a second semiconductor layer formed on the epitaxial substrate in sequence;

etching the epitaxial multilayer so that the epitaxial multilayer forms a plurality of side surfaces;

forming a protective layer abutted on the epitaxial multilayer;

forming a seed layer over the epitaxial multilayer and the protective layer;

forming a patterned photoresist layer on the seed layer, wherein the patterned photoresist layer comprises a plurality of limiting areas for defining positions of the thermal-conductive substrates;

forming the thermal-conductive substrates on the LED device; and forming at least one temporary substrate on a side of the LED device.

20. The manufacturing method according to claim 19, further comprising steps of:

removing the epitaxial substrate to expose a side of the epitaxial multilayer;

forming a plurality of electrodes on the exposed side of the epitaxial multilayer;

etching the epitaxial multilayer, the protective layer and the seed layer between two of the thermal-conductive substrates from the exposed side of the epitaxial multilayer; and removing the temporary substrate to form the plurality of LED apparatuses.

21. A manufacturing method of a plurality of light-emitting diode (LED) apparatuses, the method comprising steps of:

providing a LED device, wherein the LED device comprises an epitaxial substrate and an epitaxial multilayer formed on the epitaxial substrate, and the epitaxial multilayer comprises a first semiconductor layer, a light emitting layer and a second semiconductor layer formed on the epitaxial substrate in sequence;

etching the epitaxial multilayer so that the epitaxial multilayer forms a plurality of side surfaces, and a portion of the first semiconductor layer is exposed;

forming a protective layer on the side surfaces;

forming a plurality of electrodes on the epitaxial multilayer and the exposed portion of the first semiconductor layer, wherein the temporary substrate covers the electrodes;

forming at least one temporary substrate on a side of the LED device, wherein the temporary substrate covers the electrodes;

removing the epitaxial substrate to expose a side of the epitaxial multilayer;

forming a seed layer on the exposed side of the epitaxial multilayer;

forming a patterned photoresist layer on the seed layer, wherein the patterned photoresist layer comprises a plurality of limiting areas for defining positions of a plurality of thermal-conductive substrates;

forming the thermal-conductive substrates on the LED device; and removing the temporary substrate to form the plurality of LED apparatuses.

22. A manufacturing method of a plurality of light-emitting diode (LED) apparatuses, the method comprising steps of:

providing a LED device, wherein the LED device comprises an epitaxial substrate and an epitaxial multilayer formed on the epitaxial substrate, and the epitaxial multilayer comprises a first semiconductor layer, a light emitting layer and a second semiconductor layer formed on the epitaxial substrate in sequence;

forming an patterned etching stop layer on the epitaxial multilayer to expose a portion of the epitaxial multilayer;

forming a seed layer over the exposed epitaxial multilayer and the patterned etching stop layer;

forming a patterned photoresist layer on the seed layer, wherein the patterned photoresist layer comprises a plurality of limiting areas for defining positions of the thermal-conductive substrates, and the patterned photoresist layer corresponds to the patterned etching stop layer;

forming the thermal-conductive substrates on the LED device; and forming at least one temporary substrate on a side of the LED device.

23. The manufacturing method according to claim 22, further comprising steps of:

removing the epitaxial substrate to expose a side of the epitaxial multilayer;

etching the epitaxial multilayer to the patterned etching stop layer;

forming a protective layer abutted on the epitaxial multilayer;

forming a plurality of electrodes on the exposed side of the epitaxial multilayer; and removing the temporary substrate to form the plurality of LED apparatuses.

24. The manufacturing method according to claim 22, further comprising steps of:

removing the epitaxial substrate to expose a side of the epitaxial multilayer;

etching the epitaxial multilayer to the patterned etching stop layer and exposing a portion of the second semiconductor layer;

forming a plurality of electrodes on the exposed side of the epitaxial multilayer and the exposed portion of the second semiconductor layer;

forming a protective layer abutted on the epitaxial multilayer; and removing the temporary substrate to form the plurality of LED apparatuses.

* * * * *